(12) United States Patent
Ooi et al.

(10) Patent No.: US 11,104,813 B2
(45) Date of Patent: Aug. 31, 2021

(54) DISPERSION

(71) Applicant: Asahi Kasei Kabushiki Kaisha, Tokyo (JP)

(72) Inventors: Hirotaka Ooi, Tokyo (JP); Eiichi Ohno, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 860 days.

(21) Appl. No.: 15/578,879

(22) PCT Filed: Jun. 2, 2016

(86) PCT No.: PCT/JP2016/066499
§ 371 (c)(1),
(2) Date: Dec. 1, 2017

(87) PCT Pub. No.: WO2016/195047
PCT Pub. Date: Dec. 8, 2016

(65) Prior Publication Data
US 2018/0171159 A1    Jun. 21, 2018

(30) Foreign Application Priority Data

Jun. 2, 2015   (JP) .............................. JP2015-112579
Jun. 2, 2015   (JP) .............................. JP2015-112580
Dec. 28, 2015  (JP) .............................. JP2015-256929

(51) Int. Cl.
| | | |
|---|---|---|
| C09D 5/24 | (2006.01) | |
| H01B 1/22 | (2006.01) | |
| H01B 5/14 | (2006.01) | |
| C08L 71/02 | (2006.01) | |
| C09D 201/00 | (2006.01) | |
| C08K 3/22 | (2006.01) | |
| C08K 3/08 | (2006.01) | |
| H01B 13/00 | (2006.01) | |
| C09D 17/00 | (2006.01) | |
| C09D 7/40 | (2018.01) | |
| B22F 1/00 | (2006.01) | |
| H05K 1/09 | (2006.01) | |
| B22F 7/04 | (2006.01) | |
| C09D 7/45 | (2018.01) | |
| C09D 171/02 | (2006.01) | |
| H05K 3/12 | (2006.01) | |

(52) U.S. Cl.
CPC .............. C09D 5/24 (2013.01); B22F 1/0022 (2013.01); B22F 1/0062 (2013.01); B22F 7/04 (2013.01); C08K 3/08 (2013.01); C08K 3/22 (2013.01); C08L 71/02 (2013.01); C09D 7/40 (2018.01); C09D 7/45 (2018.01); C09D 7/67 (2018.01); C09D 7/68 (2018.01); C09D 17/00 (2013.01); C09D 171/02 (2013.01); C09D 201/00 (2013.01); H01B 1/22 (2013.01); H01B 5/14 (2013.01); H01B 13/00 (2013.01); H01B 13/0036 (2013.01); H05K 1/097 (2013.01); B22F 2001/0092 (2013.01); B22F 2007/047 (2013.01); C08K 2003/0806 (2013.01); C08K 2003/2248 (2013.01); C08K 2201/001 (2013.01); C08K 2201/005 (2013.01); C08K 2201/011 (2013.01); H05K 1/092 (2013.01); H05K 3/1283 (2013.01); H05K 2201/0269 (2013.01)

(58) Field of Classification Search
CPC .................................... C09D 5/24; C09D 7/45
See application file for complete search history.

(56) References Cited

U.S. PATENT DOCUMENTS

| | | | |
|---|---|---|---|
| 2005/0069648 A1 | 3/2005 | Maruyama | |
| 2007/0290175 A1* | 12/2007 | Kim | ........................ B22F 1/025 252/500 |
| 2012/0091401 A1 | 4/2012 | Hotta | |
| 2012/0267151 A1 | 10/2012 | Hojo et al. | |
| 2015/0252157 A1 | 9/2015 | Ogura et al. | |
| 2016/0004154 A1* | 1/2016 | Idei | ........................ G03F 7/0048 359/885 |
| 2016/0024316 A1* | 1/2016 | Sasada | ..................... H01B 1/22 427/553 |
| 2016/0024317 A1 | 1/2016 | Hayata et al. | |

FOREIGN PATENT DOCUMENTS

| | | |
|---|---|---|
| CN | 102453374 A | 5/2012 |
| JP | S62-292870 A | 12/1987 |
| JP | 2005-015628 A | 1/2005 |
| JP | 2006-273936 A | 10/2006 |
| JP | 4622626 B2 | 2/2011 |
| JP | 5084145 B2 | 11/2012 |
| JP | 2013-206721 A | 10/2013 |
| JP | 2014-071963 A | 4/2014 |
| JP | 2014-088550 A | 5/2014 |
| JP | 2014-199720 A | 10/2014 |

(Continued)

OTHER PUBLICATIONS

Supplementary European Search Report issued in European Patent Application No. 16803481.7 dated Jul. 19, 2018.

(Continued)

Primary Examiner — Marc S Zimmer
(74) Attorney, Agent, or Firm — Morgan, Lewis & Bockius LLP

(57) ABSTRACT

A dispersion which contains a dispersant and particles selected from among metal particles and metal oxide particles, and which is characterized in that: the dispersant has a chemical structure that is able to be bonded or adsorbed to the particles; and the dispersant contains a low-molecular-weight dispersant that has at least one peak within a molecular weight region of 31 or more but less than 1,000 in the molecular weight distribution curve in terms of polyethylene glycol as determined by gel permeation chromatography and a high-molecular-weight dispersant that has at least one peak within a molecular weight region of 1,000 or more but 40,000 or less in the above-described molecular weight distribution curve.

7 Claims, 9 Drawing Sheets

(56) References Cited

FOREIGN PATENT DOCUMENTS

| JP | 2015-210973 A | 11/2015 |
|----|---------------|---------|
| WO | 03/051562 A1 | 6/2003 |
| WO | 2011/040189 A1 | 4/2011 |
| WO | 2014/017323 A1 | 1/2014 |
| WO | 2014/054539 A1 | 4/2014 |
| WO | WO 2017/146741 * | 8/2017 |

OTHER PUBLICATIONS

Supplemental European Search Report issued in corresponding European Patent Application No. 16803481.7 dated Oct. 25, 2018.
Yokota et al., "Low-voltage organic transistor with subfemtoliter inkjet source-drain contacts," MRS Communications, 1: 3-6 (2011).
Feldmann et al., "Polyol-Mediated Preparation of Nanoscale Oxide Particles," Angewandte Chemie International Edition, 40: 359-362 (2001).
Rockenberger et al., "A New Nonhydrolytic Single-Precursor Approach to Surfactant-Capped Nanocrystals of Transition Metal Oxides," Journal of the American Chemical Society, 121: 11595-11596 (1999).
International Preliminary Report on Patentability and Written Opinion issued in corresponding International Patent Application No. PCT/JP2016/066499 dated Dec. 14, 2017.
International Search Report issued in corresponding International Patent Application No. PCT/JP2016/066499 dated Jul. 26, 2016.

\* cited by examiner (a)

(b)

(c)

DISPERSION

TECHNICAL FIELD

The present invention relates to a dispersion.

BACKGROUND ART

Circuit boards have a structure with conductive wiring formed on a substrate. Such circuit boards have conventionally been produced by a process in which a photoresist coated onto a metal foil-attached substrate is worked into a desired negative-type circuit pattern by exposure and development, and then the metal foil at the sections not coated with the resist is removed by chemical etching to form a pattern. By such a conventional method for producing circuit boards it is possible to produce high performance conductive substrates. However, the conventional circuit board production method is disadvantageous in that it has many steps and is complex, while also requiring a photoresist material.

There has been much interest in methods that employ a process of directly printing a desired wiring pattern on a substrate using a coating material dispersing microparticles selected from the group consisting of metals and metal oxides. When a circuit board is produced by such a method, very high productivity can be expected since the number of steps is reduced and there is no need to use a photoresist material.

However, the following two problems often arise with printing methods.

First, it is generally difficult to form fine wirings by printing methods.

Second, in a printing method, it is difficult to form a conductive thin-film on a low heat-resistant base material because of the need for a high-temperature firing step to impart conductivity to the print pattern.

This will now be explained in detail.

The first problem is as follows.

There has been increasing interest in techniques that use dispersions containing metal or metal oxide nanoparticles as inks for formation of fine patterns by printing methods.

When a dispersion containing large-sized particles is used as an ink for printing, the edges and surface of the coated film are rough, and fine patterning cannot be achieved. When the coated film surface roughness is high, it can have an adverse effect on the properties of the material printed as a layer on the coated film, and therefore the smoothness of the coated film is important. With nanoparticles, however, the edges and surface of the coated film are smooth and fine patterning is possible.

Examples of known fine patterning techniques by printing methods include sub-femtoliter ink jet printing and reverse printing.

In NPL 1, for example, a fine silver electrode with L/S=1 µm/1 µm is successfully formed using a sub-femtoliter ink jet printer and silver nanoink (NPS-J-HP by Harima Chemicals, Inc.). However, sub-femtoliter ink jet printing has a very slow printing speed and is therefore unsuitable as a technique for mass production. The symbol "L/S" means "line/space". Here, "line" refers to the line width of the printed matter, and "space" refers to the width of the region without ink between the lines of the printed matter. Thus, L/S=1 µm/1 µm means a line width of 1 µm and a width of 1 µm between lines.

In PTL 1, printing with L/S=10 µm/2 µm is successfully achieved by reverse printing with a high printing speed using a dispersion comprising metallic particles, a water-soluble resin and water. In PTL 1, however, no specific countermeasure is disclosed to deal with deterioration of the dried coating film smoothness that occurs when a water-soluble resin that is solid at ordinary temperature is crystallized in the coating film. Moreover, PTL 1 does not disclose any specific strategy for improving the dispersibility and long-term storage stability.

In PTL 2, printing of a TFT source electrode and drain electrode with L/S=5 µm/5 µm is successfully achieved by reverse printing, using a dispersion comprising as essential components, conductive particles with a volume-average particle size (Mv) of 2 to 250 nm, a fluorine-based surface energy modifier and/or a silicone-based surface energy modifier, and an organic solvent containing 0.5 to 40 wt % water, and the process window of the reverse printing is also successfully widened. In PTL 2, however, no specific dispersion composition is disclosed for improving the long-term storage stability of the dispersion and the smoothness of the coated film.

The second problem is as follows.

When a printing method is employed for conductive pattern formation, the microparticles dispersed in the coating material are usually selected from among silver, gold, copper, and their oxides. Of these, microparticles including one or more selected from the group consisting of copper and copper oxides are particularly preferred because of their low cost.

For example, in PTL 3 there is proposed a cuprous oxide dispersion containing cuprous oxide microparticles with a mean secondary particle size of 80 nm or smaller, and a polyhydric alcohol of 10 or fewer carbon atoms. The dispersion is coated onto a glass plate and heat treated at 350° C. for 1 hour to form a copper thin-film with a thickness of 2.5 µm and a volume resistivity of $8 \times 10^{-5}$ Ωcm (see PTL 3, Examples 3 and 6).

In PTL 4 there is proposed a copper oxide nanoparticle dispersion coated with a protective agent. For example, a copper oxide nanoparticle dispersion using dodecylamine as the protective agent is coated onto a glass plate and heat treated at 250° C. for 60 minutes to form a copper thin-film with a mean film thickness of 1 µm and a volume resistivity of $6 \times 10^{-6}$ Ωcm (see PTL 4, Example 1).

In PTL 5 there is proposed a metal fine particle dispersion containing metal microparticles, a polymer dispersant and a dispersing medium. It is suggested in particular that a polymer dispersant with a polyester backbone or polyether backbone is easily degraded by plasma treatment and that when the dispersion of PTL 5 containing the dispersant is used, the resistance of the copper thin-film that is formed is lower. For example, a dispersion containing copper microparticles with a mean primary particle size of 50 nm as metal microparticles, SOLSPERSE 41000 (product of Lubrizol Corp.) as a polymer dispersant and toluene as a dispersing medium, is coated onto a polyethylene naphthalate film ("TEONEX Q65FA" by Teijin-DuPont Films), and then firing treatment is carried out with a microwave surface wave plasma treatment apparatus (MSP-1500, product of Micro Denshi Co., Ltd.), to form a copper thin-film with a volume resistivity of $2.4 \times 10^{-5}$ Ωcm. The base material is heated to 160° C. during this time (see PTL 5, Example 1B).

With the technique of PTL 5, however, since the base material is subjected to a high temperature of 160° C. or higher during the firing, it is not possible to form copper thin-films on base materials such as polyethylene terephthalate (PET) films, which are very inexpensive but have low heat resistance. That is, because an expensive base material must be used for application of the technique of PTL 5, it has not been possible to provide an economical printing device.

CITATION LIST

Patent Literature

[PTL 1] Japanese Patent No. 4622626
[PTL 2] International Patent Publication No. WO2014/017323
[PTL 3] Japanese Unexamined Patent Publication No. 2005-15628
[PTL 4] Japanese Patent No. 5084145
[PTL 5] International Patent Publication No. WO2011/040189

Non-Patent Literature

[NPL 1] MRS Communications, Vol. 1, p 3(2011)

SUMMARY OF INVENTION

Technical Problem

The first problem to be solved by the present invention is to provide a dispersion including particles that contain one or more selected from the group consisting of metals and metal oxides, and having excellent reverse printing suitability, coated film smoothness, dispersibility and long-term storage stability.

The second problem to be solved by the invention is to provide a dispersion that can form low-resistance copper thin-films without producing high temperature-induced damage in base materials with low heat resistance, such as PET films.

Solution to Problem

The present inventors have conducted much diligent experimentation with the aim of solving the problems described above. As a result, it was found that for a dispersion containing microparticles and a dispersant, the aforementioned problems can be solved by using a dispersant having a specific molecular weight distribution, and the present invention has thereupon been completed.

The present invention discloses the following aspects.

[1] A dispersion including particles selected from among metallic particles and metal oxide particles, and a dispersant,
wherein the dispersant has a chemical structure that is able to be bonded or adsorbed to the particles, and
the dispersant contains a low-molecular-weight dispersant that has at least one peak within a molecular weight region of 31 or greater and less than 1,000 and a high-molecular-weight dispersant that has at least one peak within a molecular weight region of 1,000 or greater and 40,000 or less, in the molecular weight distribution curve in terms of polyethylene glycol, as determined by gel permeation chromatography.

[2] The dispersion according to [1], wherein the chemical structure that is able to be bonded or adsorbed to the particles is one or more functional groups selected from the group consisting of amino groups, thiol groups, phosphonic acid groups, phosphonic acid ester groups, functional groups with a succinimide backbone, functional groups with a pyrrolidone backbone, selenol groups, polysulfide groups, polyselenide groups, carboxyl groups, functional groups with an acid anhydride backbone, sulfonic acid groups, nitro groups and cyano groups.

[3] The dispersion according to [1] or [2], wherein the low-molecular-weight dispersant has at least one peak within a molecular weight region of 350 or greater and less than 1,000 in the molecular weight distribution curve in terms of polyethylene glycol, as determined by gel permeation chromatography.

[4] The dispersion according to any one of [1] to [3], wherein the proportion of the high-molecular-weight dispersant in the dispersant is 5 parts by mass or greater and 500 parts by mass or less with respect to 100 parts by mass of the low-molecular-weight dispersant.

[5] The dispersion according to any one of [1] to [4], wherein:
the proportion of the low-molecular-weight dispersant is 1 part by mass to 20 parts by mass, and
the proportion of the high-molecular-weight dispersant is 0.1 part by mass to 10 parts by mass, with respect to 100 parts by mass of the particles.

[6] The dispersion according to any one of [1] to [5], wherein the particles contain one or more types selected from the group consisting of copper and copper oxide.

[7] The dispersion according to any one of [1] to [6], wherein the mean secondary particle size of the particles is 5 nm or greater and 1,000 nm or less.

[8] The dispersion according to any one of [1] to [7], wherein the dispersant has one or more backbones selected from the group consisting of polyethylene glycol and polypropylene glycol.

[9] A method for producing a conductive film which includes:
a step of coating a dispersion according to any one of [1] to [8] onto a base material to form a coated film, and
a step of heated firing of the coated film.

[10] The method for producing a conductive film according to [9], wherein the heating step is carried out by plasma treatment, flash lamp annealing treatment, or contact treatment with a heating medium.

[11] A dispersion containing:
particles comprising one or more types selected from the group consisting of copper and copper oxides, and
one or more sulfur atom-containing substances selected from the group consisting of compounds with an —SH group, elemental sulfur, and compounds having a structure with multiple sulfur atoms bonded in succession.

[12] A film including particles selected from among metallic particles and metal oxide particles, and a dispersant,
wherein the dispersant has a chemical structure that is able to be bonded or adsorbed to the particles, and
the dispersant contains a low-molecular-weight dispersant that has at least one peak within a molecular weight region of 31 or greater and less than 1,000 and a high-molecular-weight dispersant that has at least one peak within a molecular weight region of 1,000 or greater and less than 40,000, in the molecular weight distribution curve in terms of polyethylene glycol, as determined by gel permeation chromatography.

[13] A film containing:
particles comprising one or more types selected from the group consisting of copper and copper oxides, and
one or more sulfur atom-containing substances selected from the group consisting of compounds with an —SH group, elemental sulfur, and compounds having a structure with multiple sulfur atoms bonded in succession.

[14] A conductive film comprising at least a metal, a metal oxide and an organic material,
wherein when the conductive film has been divided into two in the thickness direction, one of the side halves has a higher concentration of the metal while the other has a higher concentration of the metal oxide.

[15] The conductive film according to [14], wherein in the relative element concentration profile in the thickness direction as measured by etching and elemental analysis, the relative element concentration of the metal in the half with the higher metal concentration of the side halves is 70% or greater.

[16] The conductive film according to [14], wherein in the relative element concentration profile in the thickness direction as measured by etching and elemental analysis, the relative element concentration of oxygen from the metal oxide in the half with the lower metal concentration of the side halves is 1% or greater and 50% or less.

Advantageous Effects of Invention

Firstly, according to the invention, it is possible to obtain a dispersion including particles that contain one or more selected from the group consisting of metals and metal oxides, and having excellent reverse printing suitability, coated film smoothness, dispersibility and long-term storage stability.

Secondly, according to the invention, it is possible to obtain a dispersion that can form a low-resistance conductive thin-film without producing high temperature-induced damage in a low-heat-resistance base material.

DESCRIPTION OF EMBODIMENTS

Figure 1:
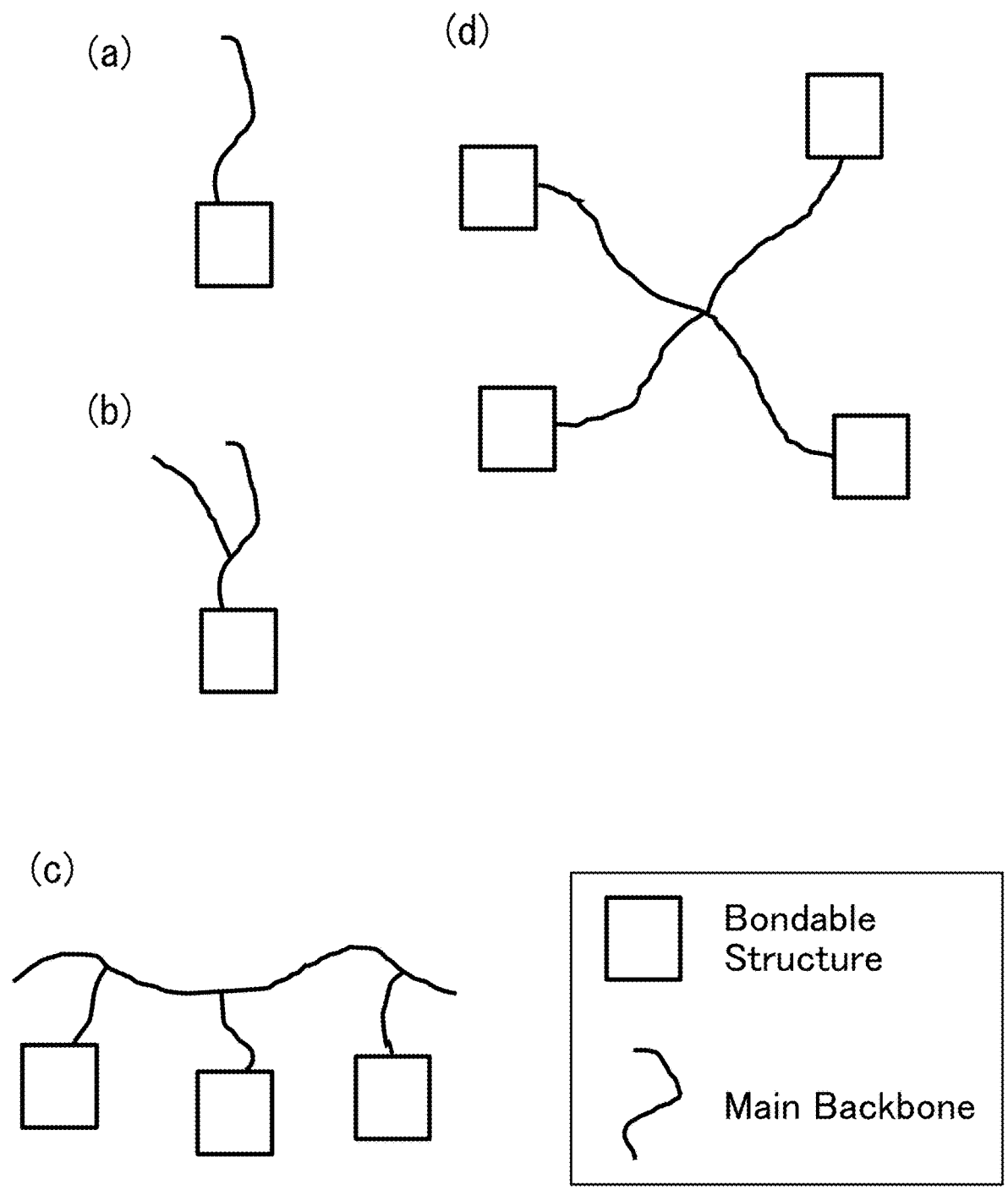
FIG. 1 is a schematic view showing the structure of a dispersant according to an embodiment of the invention.

According to the first aspect, the dispersion of this embodiment contains a dispersant and particles selected from among metallic particles and metal oxide particles.

According to the second aspect, the dispersion of this embodiment contains a sulfur atom-containing substance and particles selected from among metallic particles and metal oxide particles.

Each of the constituent elements of the dispersion of the invention will now be explained in detail.

[Particles]

The particles in the dispersion of this embodiment are selected from among metallic particles and metal oxide particles. As metals and metal oxides for the particles there may be used microparticles containing one or more selected from the group consisting of gold, silver, copper, nickel, cobalt, tin, lead, indium, aluminum, zirconium, cerium, hafnium, magnesium, and oxides of these metals. In particular, copper and copper oxides are preferred, as they are inexpensive and can form wirings with low resistance by firing. Specific examples of copper and copper oxides include particles made of copper, cuprous oxide, cupric oxide, copper oxides with other oxidation numbers, and particles having a core/shell structure where the core section is copper and the shell section is copper oxide. Of these, cuprous oxide and cupric oxide are preferred as they tend to have excellent dispersibility. Cuprous oxide is particularly preferred since it tends to facilitate low-temperature sintering. These may also include metal salts or metal complexes, or both, as trace impurities.

They may be used alone, or more than one type may be used in admixture.

There are no particular restrictions on the mean secondary particle size of the particles in the dispersion of this embodiment. However, it is preferably no greater than 1,000 nm, more preferably no greater than 500 nm, even more preferably no greater than 200 nm and most preferably no greater than 80 nm. The mean secondary particle size of the particles is preferably 5 nm or greater, more preferably 15 nm or greater and even more preferably 20 nm or greater. The mean secondary particle size is the mean particle size of aggregates (secondary particles) formed by grouping of multiple primary particles. The mean secondary particle size is preferably 1,000 nm or smaller since this will tend to facilitate formation of a fine pattern on the substrate. The mean secondary particle size is also preferably 5 nm or greater since this will increase the long-term storage stability of the dispersion. The mean secondary particle sizes of microparticles can be measured by the cumulant method, using an FPAR-1000 by Otsuka Electronics Co., Ltd., for example.

The preferred range for the mean primary particle size of primary particles composing the secondary particles is 100 nm or smaller, more preferably 50 nm or smaller and even more preferably 20 nm or smaller. The mean primary particle size is preferably 1 nm or larger, more preferably 2 nm or larger and even more preferably 5 nm or larger. If the mean primary particle size is 100 nm or smaller, it will tend to be possible to lower the firing temperature as described below. The reason for which such low temperature firing becomes possible is presumably that a smaller particle size of the particles increases the surface energy and lowers the melting point. Also, a mean primary particle size of 1 nm or larger is preferred since this will allow satisfactory dispersibility to be obtained. The mean primary particle size can be measured with a transmission electron microscope or a scanning electron microscope.

The content of particles in the dispersion of this embodiment is preferably 0.50 mass % to 70 mass %, more preferably 1.0 to 60 mass % and even more preferably 5.0 to 50 mass %, with respect to the total amount of the dispersion. If the content is 70 mass % or lower, it will tend to be easier to suppress aggregation of the particles. The content is preferably 0.50 mass % or greater since the conductive film obtained by firing will not be too thin and the conductivity will tend to be satisfactory.

The particles used for this embodiment may be a commercial product or a synthesized substance. Examples of commercial products include cupric oxide microparticles with a mean primary particle size of 50 nm by CIK NanoTek Corp. The following methods may be mentioned as examples of synthesis methods.

(1) A method in which water and a copper-acetylacetonate complex are added to a polyol solvent, the organic copper compound is once heated to dissolution, and then water in an amount necessary for reaction is added and the temperature is further increased for heated reduction to the reduction temperature of the organic copper.

(2) A method of heating an organic copper compound (copper-N-nitrosophenylhydroxylamine complex) in an inert atmosphere in the presence of a protective agent such as hexadecylamine, at a high temperature of about 300° C.

(3) A method of reducing a copper salt dissolved in an aqueous solution using hydrazine.

Method (1) above can be carried out under the conditions described in Angewandte Chemie International Edition 40, Vol. 2, p. 359, 2001, for example.

Method (2) can be carried out under the conditions described in Journal of the American Chemical Society, 1999, Vol. 121, p. 11595, for example.

In the method of (3) above, the copper salt used is preferably a divalent copper salt, examples of which include copper(II) acetate, copper(II) nitrate, copper(II) carbonate, copper(II) chloride and copper(II) sulfate. The amount of hydrazine used is preferably 0.2 mol to 2 mol and more preferably 0.25 mol to 1.5 mol with respect to 1 mol of the copper salt.

A water-soluble organic compound may be added to the aqueous solution in which the copper salt has been dissolved. Adding a water-soluble organic compound to the aqueous solution lowers the melting point of the aqueous solution, so that reduction is possible at a lower temperature. Examples for the water-soluble organic compound to be used include alcohols and water-soluble polymers.

Examples of alcohols include methanol, ethanol, propanol, butanol, hexanol, octanol, decanol, ethylene glycol, propylene glycol and glycerin. Examples of water-soluble polymers include polyethylene glycol, polypropylene glycol and polyethylene glycol-polypropyleneglycol copolymer.

The temperature during reduction in the method of (3) above may be −20° C. to 60° C., for example, and is preferably −10° C. to 30° C. The reduction temperature may be constant, or the temperature may be increased or decreased, during the reaction. The initial reaction, for high hydrazine activity, is preferably reduction at 10° C. or below and more preferably reduction at 0° C. or below. The reduction time is preferably 30 minutes to 300 minutes and more preferably 90 minutes to 200 minutes. The atmosphere during reduction is preferably an inert atmosphere such as nitrogen or argon.

Of these, the method of (3) is preferred since it is a convenient procedure and can produce particles with small particle sizes.

[Dispersant]

The dispersion of the first aspect of the dispersion of this embodiment contains a dispersant for the purposes of improving the reverse printing suitability and coated film smoothness, and increasing the long-term storage stability. The dispersant will now be explained in detail.

The dispersant of this embodiment has a chemical structure that is able to be bonded or adsorbed to the particles. A preferred dispersant for this embodiment has a main backbone and a chemical structure that is able to be bonded or adsorbed to the particles (hereunder referred to as "bondable structure").

Figure 2:
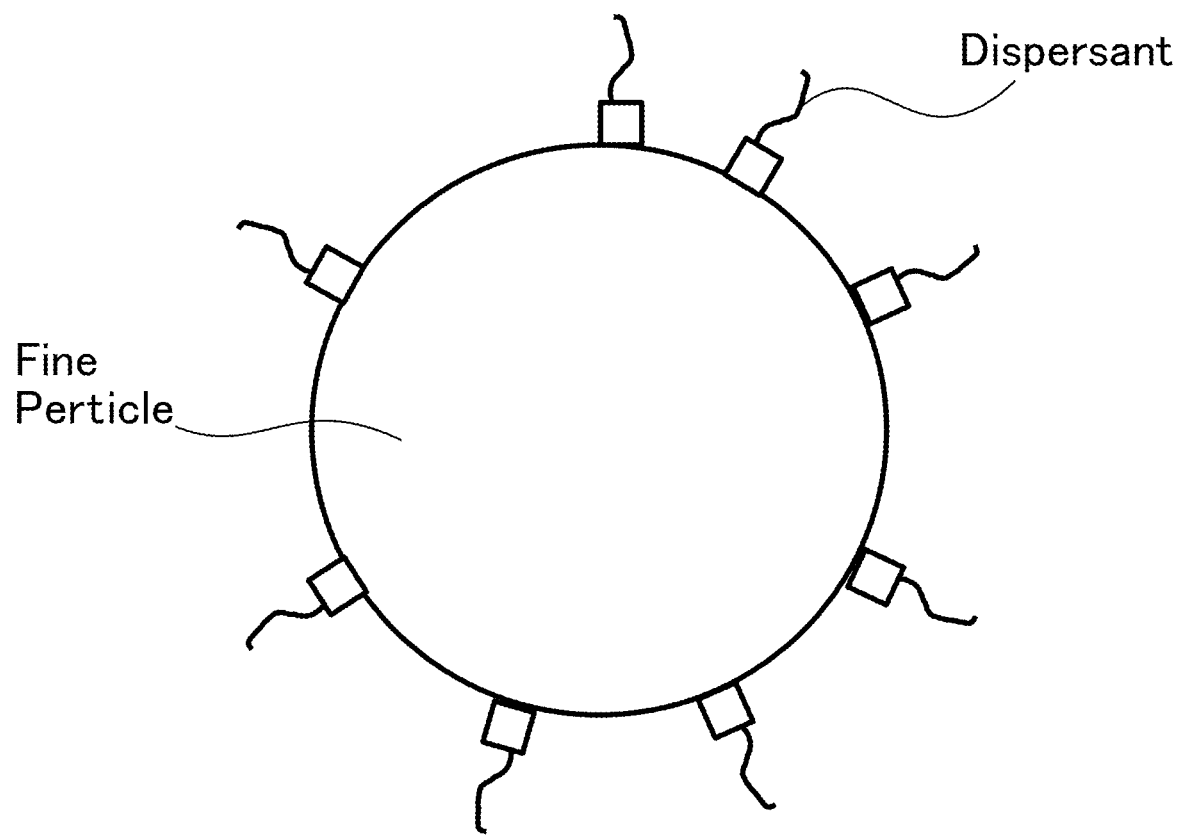
FIG. 2 is a simplified cross-sectional view schematically showing a dispersant-adsorbed particle, according to an embodiment of the invention.

The state of such a dispersant functioning in a dispersion of this embodiment is illustrated schematically in FIG. 2. In FIG. 2, the large central circle is a particle containing one or more selected from the group consisting of metals and metal oxide particles. It is conjectured that the main backbones of the dispersant, shown as curves, are bonded or adsorbed to the particle via the bondable structures, indicated by rectangular shapes. It is conjectured that such a form is able to increase the long-term storage stability of the dispersion by preventing fusion between the particles by electrostatic repulsion or steric hindrance, and maintaining the dispersed state of the particles in the dispersion. When the dispersion has been coated onto a base material, the main backbones of the dispersant that have been bonded or adsorbed to the particles become entangled, thereby allowing the strength of the coated film to be increased and thus allowing the reverse printing suitability to be improved.

Bonding or adsorption means the behavior of any type of attraction between two substances, such as hydrogen bonding, covalent bonding, metal bonding, ionic bonding, coordination bonding, intermolecular forces, hydrophobic interaction, hydrophilic interaction, π-π interaction, σ-π interaction, or other electronic interaction.

The structure of the dispersant is not particularly restricted. For example, it may be a straight-chain structure as shown in the (a) portion of FIG. 1;

it may be a branched structure as shown in the (b) portion of FIG. 1;

it may be a graft polymer-type structure with bondable structures in side chains, as shown in the (c) portion of FIG. 1;

it may be a structure having a bondable structure at each of the ends of a star-shaped polymer, as shown in the (d) portion of FIG. 1; or it may be a structure resulting from a combination of any of these structures.

Examples of bondable structures in the dispersant include amino groups, thiol groups, phosphonic acid groups, phosphonic acid ester groups, functional groups with a succinimide backbone, functional groups with a pyrrolidone backbone, selenol groups, polysulfide groups, polyselenide groups, carboxyl groups, functional groups with an acid anhydride backbone, sulfonic acid groups, nitro groups and cyano groups, as well as structures represented by the following chemical formulas.

[Chemical Formula 1]

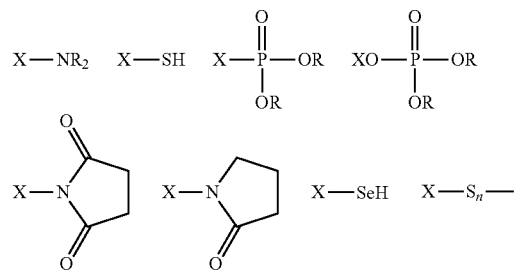

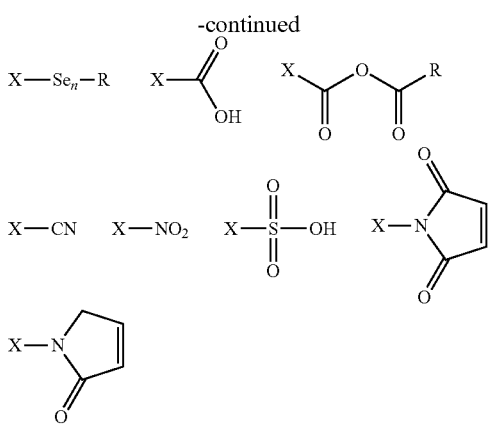

In these chemical formulas, n is an integer of 1 or greater, X is the main backbone of the dispersant, and R is a functional group. Examples of functional groups represented by R in the chemical formulas include hydrogen, halogens, alkyl groups (for example, a methyl group, isopropyl group or tertiary butyl group), aryl groups (for example, a phenyl group, naphthyl group or thienyl group), haloaryl groups (for example, a pentafluorophenyl group, 3-fluorophenyl group or 3,4,5-trifluorophenyl group), alkenyl groups, alkynyl groups, amide groups, acyl groups, alkoxy groups (for example, a methoxy group), aryloxy groups (for example, a phenoxy group or naphthyl group), haloalkyl groups (for example, a perfluoroalkyl group), thiocyano groups, hydroxyl groups, amino groups, thiol groups, phosphonic acid groups, phosphonic acid ester groups, functional groups with a succinimide backbone, functional groups with a pyrrolidone backbone, selenol groups, polysulfide groups, polyselenide groups, carboxylic acid groups, functional groups with an acid anhydride backbone, sulfonic acid groups, nitro groups, cyano groups, and structures with combinations of these.

In the dispersant, the chemical structure that is able to be bonded or adsorbed to the particles is preferably one or more types of functional groups selected from the group consisting of amino groups, thiol groups, phosphonic acid groups, phosphonic acid ester groups, functional groups with a succinimide backbone, functional groups with a pyrrolidone backbone, selenol groups, polysulfide groups, polyselenide groups, carboxyl groups, functional groups with an acid anhydride backbone, sulfonic acid groups, nitro groups and cyano groups.

When the particles contain silver or copper, a structure selected from among amino groups, functional groups with a pyrrolidone backbone, nitro groups and thiol groups may be suitably used from the viewpoint of long-term storage stability. When the particles include one or more selected from among copper and copper oxides, a structure selected from among functional groups with a succinimide backbone, thiol groups, carboxylic acid groups, sulfonic acid groups, phosphonic acid groups, phosphonic acid ester groups and nitro groups may be suitably used from the viewpoint of long-term storage stability. A bondable structure comprising a thiol group is more preferred because it has an effect of decreasing the resistance value of the conductive film that is obtained.

The content ratio of the bondable structure in the dispersant is preferably $2.5 \times 10^{-5}$ to 0.030 mol/g, more preferably $1.0 \times 10^{-4}$ to 0.0030 mol/g and even more preferably $2.5 \times 10^{-4}$ to 0.0010 mol/g, as the total of the number of moles of functional groups in the bondable structure in the dispersant.

The number of bondable structures per molecule of the dispersant is preferably at least 1 and not more than 100, more preferably at least 1 and not more than 20, and even more preferably at least 1 and not more than 10. If the number of bondable structures per molecule of the dispersant is too large, the particles will tend to crosslink and aggregate together. However, if the number of bondable structures per molecule of the dispersant is 100 or fewer it will be possible to obtain adequate dispersibility, if the number is 20 or fewer the secondary particle sizes can be reduced without aggregation between the particles, and if the number is 10 or fewer it will be possible to dissociate the bonds between the particles and the dispersant with relatively low energy, and therefore sintering will be promoted.

Examples for main backbones of the dispersant include polyethylene glycol (PEG), polypropylene glycol (PPG), polyimide, polyethylene terephthalate (PET), polyether sulfone (PES), polyethylene naphthalate (PEN), polyester, polycarbonate (PC), polyvinyl alcohol (PVA), polyvinyl butyral (PVB), polyacetal, polyallylate (PAR), polyamide (PA), polyamideimide (PAI), polyetherimide (PEI), polyphenylene ether (PPE), polyphenylene sulfide (PPS), polyetherketone (PEK), polyphthalamide (PPA), polyether nitrile (PEN), polybenzimidazole (PBI), polycarbodiimide, polysiloxane, polymethacrylamide, nitrile rubber, acrylic rubber, polyethylene tetrafluoride, epoxy resin, phenol resin, melamine resin, urea resin and polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyetheretherketone (PEEK), phenol-novolac, benzocyclobutene, polyvinylphenol, polychloropyrene, polyoxymethylene, polysulfone (PSF), polysulfide and silicone resins. In particular, dispersants having backbones selected from among polyethylene glycol backbones, polypropylene glycol backbones, polyacetal backbones, polybutene backbones and polysulfide backbones are preferred because they are easily degraded, and are less likely to leave a residue in the conductive film obtained after firing; dispersants having backbones selected from among polyethylene glycol and polypropylene glycol are more preferred because they are less likely to permeate into printing plates and the printing plates are less likely to deform by swelling. Printing plates include a removal plate and blanket, which are used in the reverse printing described below. These structures may be present alone in the main backbone of the dispersant, or their copolymers may be present.

The dispersant may also have a functional group separate from the main backbone and bondable structure. Examples of such functional groups include halogens, alkyl groups (for example, a methyl group, isopropyl group or tertiary butyl group), aryl groups (for example, a phenyl group, naphthyl group or thienyl group), haloaryl groups (for example, a pentafluorophenyl group, 3-fluorophenyl group or 3,4,5-trifluorophenyl group), alkenyl groups, alkynyl groups, amide groups, acyl groups, alkoxy groups (for example, a methoxy group), aryloxy groups (for example, a phenoxy group or naphthyl group) haloalkyl groups (for example, a perfluoroalkyl group), thiocyano groups and hydroxyl groups.

Specifically, poly(ethylene glycol) methyl ether thiol may be suitably used as a dispersant.

The dispersant contains a low-molecular-weight dispersant that has at least one peak within a molecular weight region of 31 or greater and less than 1,000, and a high-molecular-weight dispersant that has at least one peak within a molecular weight region of 1,000 or greater and 40,000 or less, in the molecular weight distribution curve in terms of polyethylene glycol, as determined by gel permeation chromatography (GPC).

"Peak" means a distinct peak where the slope of the molecular weight distribution curve (the derivative of the intensity on the ordinate with respect to the molecular weight on the abscissa) changes through zero from a positive value to a negative value, and does not include the "shoulders" where the sign of the slope of the molecular weight distribution curve does not change. A peak may be present at each region mentioned above, or several peaks may be present in either or both regions.

The dispersant preferably contains a low-molecular-weight dispersant with a molecular weight of 31 or greater and less than 1,000, because crystallization of the coated film will be prevented and satisfactory smoothness can be obtained. The molecular weight of the low-molecular-weight dispersant is preferably no greater than 900 to allow dissociation of gently aggregated particles and increased dispersibility of the particles, and it is more preferably no greater than 800 in order to improve the smoothness of the coating film. The molecular weight of the low-molecular-weight dispersant is preferably 31 or greater because a high wetting effect on the particles will be obtained, thus improving the dispersibility, and it is more preferably 70 or greater since satisfactory dispersibility will be obtained, and even more preferably 350 or greater since the storage stability for prolonged storage will be increased.

The dispersant preferably contains a high-molecular-weight dispersant with a molecular weight of 1,000 or greater and 40,000 or lower, because the strength of the coated film will be increased and the removability during reverse printing will be improved. The molecular weight of the high-molecular-weight dispersant is preferably 1,500 or greater because aggregation between the particles will be inhibited by steric hindrance of the dispersant that has bonded or adsorbed to the particles, thus allowing long-term storage stability to be obtained. The molecular weight of the high-molecular-weight dispersant:

is preferably no greater than 40,000 because the dispersant more readily dissolve in solvents and the concentration of the particles and dispersant can be increased;

is more preferably no greater than 20,000 because the long-term storage stability will be improved; and is even more preferably no greater than 7,000 because high dispersibility can be obtained.

As mentioned above, the dispersant of this embodiment includes low-molecular-weight dispersants and high-molecular-weight dispersants, in the molecular weight distribution curve in terms of polyethylene glycol, as determined by GPC.

The measuring conditions for GPC may be the following, for example.
Pump: Waters616
RI detector: Shimadzu RID-10A
Autosampler: Shimadzu SIL-10Avp
Column: TSKgel G3000PWXI+G2500PWXI (7.8 mmIDx 30 cm)
Column temperature: 40° C.
Eluent solvent: pH=3.5 phosphoric acid aqueous solution
Flow rate: 1.0 ml/min
Injection rate: 10 µl
Reference sample: Polyethylene oxide (Aldrich, PRODUCT No. 02393)

The GPC measurement may be carried out using the dispersant as the sample, or it may be carried out using a dispersion also containing components other than the dispersant as the sample.

When the dispersion is used as the measuring sample, the dispersion may also be subjected to pretreatment. Pretreatment is preferred because it allows the dispersant to be isolated from the dispersion. The method of pretreatment may be, for example, extraction, distillation, concentration, dilution, pH adjustment, acid addition, base addition, filtration, flocculant addition, heating and drying, cooling, vacuum drying, buffer addition, ion-exchange or centrifugal separation. Such pretreatment may be carried out alone, or more than one may be combined for combination pretreatment.

Acid addition, base addition and heating/drying will now be described as specific examples of pretreatment.

(1) Acid Addition

This pretreatment method is a method of adding an acid to the dispersion to dissolve the metal or metal oxide particles prior to GPC measurement.

Examples of acids to be added to the dispersion include sulfuric acid, nitric acid, oxalic acid, acetic acid and hydrochloric acid. The metal ion in the obtained solution may also be exchanged with another ion species using an ion exchange resin. In this case, the other ion species may be hydrogen, sodium, calcium or potassium, for example.

A base may also be added to the acid-added solution for neutralization before being supplied for measurement. Examples of bases in this case include sodium hydroxide, potassium hydroxide, calcium hydroxide, calcium carbonate, sodium carbonate and sodium hydrogencarbonate.

When a precipitate has been produced by the treatment, the precipitate is preferably filtered out before measurement.

A solvent that is immiscible with the solvent of the dispersion may also be added to the acid solution to extract the organic components into the solvent for concentration, prior to the measurement.

(2) Base Addition

This pretreatment method is a method of adding a base to the dispersion to cause dissociation of the bonds between the metal or metal oxide particles and the dispersant, prior to GPC measurement.

When the dispersant in the dispersion has an acidic structure, such as carboxylic acid, phosphonic acid or sulfonic acid, addition of a base to the dispersion can cause dissociation of the bonds between the particles and the dispersant. This can be utilized as a method for separating and analyzing the particles and dispersant.

The separated particles may be precipitated by centrifugal separation and the supernatant analyzed. The separated dispersant may be extracted and analyzed.

(3) Heating and Drying

This pretreatment method is a method of heating and drying the dispersion to cause dissociation of the bonds between the metal or metal oxide particles and the dispersant, prior to GPC measurement.

By heating and drying the dispersion it is possible to cause dissociation of the bonds between the particles and the dispersant, and cause aggregation of the particles. This can be utilized as a method for separating and analyzing the particles and dispersant.

A solvent may be added to the separated particles and dispersant to extract the dispersant, and the obtained extract may be analyzed; and the particles remaining in the extract may be removed by filtration or centrifugal separation and the obtained solution analyzed.

According to the first aspect of the dispersant of this embodiment, the proportion of the high-molecular-weight dispersant with a molecular weight of 1,000 or greater and 40,000 or less in terms of polyethylene glycol as determined by GPC is preferably 5 parts by mass or greater and 500 parts by mass or less with respect to 100 parts by mass of the low-molecular-weight dispersant with a molecular weight of 31 or greater and less than 1,000 in terms of polyethylene glycol as determined by GPC. The proportion of the high-molecular-weight dispersant is preferably 500 parts by mass or less with respect to 100 parts by mass of the low-molecular-weight dispersant because crystallization of the coated film will be prevented and the smoothness can be improved, it is preferably 300 parts by mass or less because the long-term storage stability can be increased, and it is more preferably 100 parts by mass or less because high dispersibility can be obtained. The value is preferably 5 parts by mass or greater because the coated film strength will be increased and the removability during reverse printing will be improved. The value is more preferably 10 parts by mass or greater and even more preferably 20 parts by mass or greater.

The proportion of the high-molecular-weight dispersant and the low-molecular-weight dispersant in the dispersant can be determined as the ratio between the area corresponding to a molecular weight region of 31 or greater and less than 1,000 and the area corresponding to a region of molecular weight 1,000 or greater and 40,000 or less, in the molecular weight distribution curve in terms of polyethylene glycol, as determined by GPC.

The content of the dispersant according to the first aspect of the dispersion of this embodiment is preferably 1 part by mass or greater, more preferably 5 parts by mass or greater and even more preferably 10 parts by mass or greater, with respect to 100 parts by mass of the particles. The content of the dispersant is preferably 100 parts by mass or less, more preferably 50 parts by mass or less and even more preferably 30 parts by mass or less, with respect to 100 parts by mass of the particles. If the content of the dispersant with respect to 100 parts by mass of the particles is 1 part by mass or greater, the particles will not aggregate and sufficient dispersibility will be obtained. If the content of the dispersant with respect to 100 parts by mass of the particles exceeds 100 parts by mass, the resistance of the conductive film obtained will increase by residue of the dispersant.

According to the first aspect of the dispersion of this embodiment, preferably the proportion of the low-molecular-weight dispersant is 1 part by mass to 20 parts by mass and the proportion of the high-molecular-weight dispersant is 0.1 part by mass to 10 parts by mass, from the viewpoint of exhibiting satisfactory reverse printing properties.

The dispersant is preferably a liquid at 20° C. in order to obtain a coated film with high smoothness.

[Sulfur Atom-Containing Substance]

According to the second aspect, the dispersion of this embodiment contains a sulfur atom-containing substance.

A sulfur atom-containing substance is an organic material or inorganic material that includes a sulfur atom in the molecular structure. By adding a sulfur atom-containing substance to the dispersion of this embodiment, the firing temperature required to impart conductivity to the coating film can be lowered, and damage to the base material by high-temperature firing can be reduced.

The reason why conductivity is sufficiently imparted with low-temperature firing is thought to be that, due to the reducing power of the sulfur atom, oxidation of the particles in the dispersion is prevented when the particles are metallic particles, and reduction of the particles in the dispersion is accelerated when the particles are metal oxide particles, and therefore a conductive film with low resistance is obtained even at a low firing temperature.

According to a second aspect of this embodiment, the particles used together with the sulfur atom-containing substance are preferably particles containing one or more selected from the group consisting of copper and copper oxides. Specific examples include particles made of copper, cuprous oxide, cupric oxide, copper oxides with other oxidation numbers, and particles having a core/shell structure where the core section is copper and the shell section is copper oxide. Of these, cuprous oxide and cupric oxide are preferred as they tend to have excellent dispersibility. Cuprous oxide is particularly preferred since it tends to be easily sintered at low temperature. These may also include metal salts or metal complexes, or both, as trace impurities.

The particles of this embodiment may be used as a single type alone, or several types may be used in admixture.

From the viewpoint of lowering the resistance of the conductive film that is formed, the sulfur atom-containing substance used is preferably one or more selected from among compounds with an —SH group, elemental sulfur and compounds having a structure with multiple sulfur atoms bonded in succession. Sulfur-hydrogen bonds and sulfur-sulfur bonds have low energy required for dissociation and can easily form active radicals or ions. The radicals or ions that are produced are thought to prevent oxidation of the metal and promote reduction of the metal oxide. In other words, when added to the dispersion of this embodiment, these sulfur atom-containing substances can result in a conductive film with even lower energy.

Compounds with —SH groups include organic materials with —SH groups and inorganic materials with —SH groups.

As organic materials with —SH groups there may be used compounds having an —SH group introduced into the main backbone of the polymer, for example.

Examples of main backbones of polymers include polyethylene glycol (PEG), polyimide, polyethylene terephthalate (PET), polyethersulfone (PES), polyethylene naphthalate (PEN), polyester, polycarbonate (PC), polyvinyl alcohol (PVA), polyvinyl butyral (PVB), polyacetal, polyallylate (PAR), polyamide (PA), polyamideimide (PAI), polyetherimide (PEI), polyphenylene ether (PPE), polyphenylene sulfide (PPS), polyether ketone (PEK), polyphthalamide (PPA), polyethernitrile (PEN), polybenzimidazole (PBI), polycarbodiimide, polysiloxane, polymethacrylamide, nitrile rubber, acrylic rubber, polyethylene tetrafluoride, epoxy resins, phenol resins, melamine resins, urea resins, polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyether ether ketone (PEEK), phenol-novolac, benzocyclobutene, polyvinylphenol, polychloroprene, polyoxymethylene, polysulfone (PSF), polysulfide and silicone resins. Polyethylene glycol backbone, polyacetal backbone, polybutene backbone and polysulfide backbone are particularly preferred because they are easily degraded. These may be used alone, or more than one may be used in admixture. A specific example of an organic material with an —SH group and having a main backbone in the polymer is poly(ethylene glycol) methyl ether thiol.

Examples of organic materials with —SH groups include alkanethiols, fluoroalkanethiols, branched alkanethiols, thiols with an amide bond, thiols with an ester bond, thiols with a double bond between carbon atoms, dithiols, organic salts with an —SH structure, thiols with an oxyethylene backbone, thiols with a heterocyclic backbone, thiols with an —OH group, thiols with an organometallic complex backbone, thiols with an azide group, thiols with a carboxy group, thiols with a phosphonic acid group, thiols with an NHS group, thiols with a halogen atom, thiols with an aromatic ring, thiols with an alicyclic compound backbone, and thiols with a boron compound backbone.

Examples of alkanethiols that may be used include ethanethiol, butanethiol, decanethiol, heptanethiol, hexadecanethiol, hexanethiol, nonanethiol, octadecanethiol, octanethiol, pentanethiol, pentadecanethiol, propanethiol, tetradecanethiol and undecanethiol.

Examples of fluoroalkanethiols that may be used include 11-mercaptoundecyl trifluoroacetate, 1H,1H,2H,2H-perfluorodecanethiol and 3,3,4,4,5,5,6,6,6-nonafluoro-1-hexanethiol.

Examples of branched alkanethiols that may be used include 2-ethylhexanethiol, 2-methyl-1-propanethiol, 2-methyl-2-propanethiol, 3-methyl-1-butanethiol, tert-dodecylmercaptane and tert-nonylmercaptane.

Examples of thiols with amide bonds that may be used include 3-mercapto-N-nonylpropionamide and 11-mercaptoundecaneamide.

An example of a thiol with a cyano group that may be used is 4-cyano-1-butanethiol.

Examples of thiols with ester bonds that may be used include butyl-3-mercapto propionate and 3-mercaptomethyl propionate.

Examples of thiols with double bonds between carbon atoms that may be used include cis-9-octadecene-1-thiol, dithiols (1,11-undecanedithiol, 1,16-hexadecanedithiol, 1,2-ethanedithiol, 1,3-propanedithiol, 1,4-butanedithiol, 1,5-pentanedithiol, 1,6-hexanedithiol, 1,8-octanedithiol, 1,9-nonanedithiol, 2,2'-(ethylenedioxy)diethanethiol, 2,3-butanedithiol, 5,5'-bis(mercaptomethyl)-2,2'-bipyridine, hexa(ethylene glycol)dithiol, tetra(ethylene glycol)dithiol and benzene-1,4-dithiol), and 1,4-benzenedimethanethiol.

Examples of organic salts with —SH structures that may be used include (11-mercaptoundecyl)-N,N,N-trimethylammonium bromide, 11-amino-1-undecanethiol hydrochloride, 16-amino-1-hexadecanethiol hydrochloride, 3-amino-1-propanethiol hydrochloride, 6-amino-1-hexanethiol hydrochloride and 8-amino-1-octanethiol hydrochloride.

Examples of thiols with oxyethylene backbones that may be used include (11-mercaptoundecyl)tetra(ethylene glycol) and triethyleneglycol mono-11-mercaptoundecyl ether.

Examples of thiols with heterocyclic backbones that may be used include 1-(11-mercaptoundecyl)imidazole and 11-(1H-pyrrol-1-yl)undecane-1-thiol.

Examples of thiols with —OH groups that may be used include 1-mercapto-2-propanol, 3-mercapto-1-propanol, 4-mercapto-1-butanol, 6-mercapto-1-hexanol, 8-mercapto-1-octanol, 9-mercapto-1-nonanol, 10-mercapto-1-decanol, 11-mercapto-1-undecanol and 11-mercaptoundecylhydroquinone.

Examples of thiols with organometallic complex backbones that may be used include 11-(ferrocenyl)undecanethiol and 6-(ferrocenyl)hexanethiol.

An example of a thiol with an azide group that may be used is 11-azido-1-undecanethiol.

Examples of thiols with carboxy groups that may be used include 11-mercaptoundecanoic acid, 12-mercaptododecanoic acid, 3-mercaptopropionic acid, 6-mercaptohexanoic acid and 8-mercaptooctanoic acid.

An example of a thiol with a phosphonic acid group that may be used is 11-mercaptoundecylphosphonic acid.

An example of a thiol with an NHS group that may be used is 12-mercaptododecanoic acid NHS ester.

An example of a thiol with a halogen atom that may be used is 3-chloro-1-propanethiol.

Examples of thiols with aromatic rings that may be used include 1,1',4',1"-terphenyl-4-thiol, 1-naphthalenethiol, 2-phenylethanethiol, 4'-bromo-4-mercaptobiphenyl, 4'-mercaptobiphenylcarbonitrile, 4,4'-bis(mercaptomethyl)biphenyl, 4,4'-dimercaptostilbene, 4-(6-mercaptohexyloxy)benzyl alcohol, 4-mercaptobenzoic acid, 9-fluorenylmethylthiol, biphenyl-4,4-dithiol, biphenyl-4-thiol, p-terphenyl-4,4"-dithiol and thiophenol.

Examples of thiols with alicyclic compound backbones that may be used include 1-adamantanethiol, cyclohexanethiol and cyclopentanethiol.

Examples of thiols with boron compound backbones that may be used include m-carborane-1-thiol and m-carborane-9-thiol.

Particularly preferred among these are thiols with oxyethylene backbones, because they easily degrade.

These organic materials with —SH groups may be used alone, or more than one may be used in admixture.

An example of an inorganic material with an —SH group to be used is ammonium thiosulfate.

A compound having a structure with multiple sulfur atoms bonded in succession is a compound having in the molecule a structure represented by the following formula (1):
[Chemical Formula 2]

$$S—S \tag{1}$$

Examples of compounds having a structure with multiple sulfur atoms bonded in succession that may be suitably used include polysulfides such as disulfides, trisulfides and tetrasulfides. Disulfides, trisulfides and tetrasulfides are particularly preferred as they are stable at room temperature and allow prolonged storage of the dispersion.

The compound having a structure with multiple sulfur atoms bonded in succession may have, in addition to the structure with multiple sulfur atoms bonded in succession, also a halogen atom, nitro group, alkyl group (for example, a methyl group, isopropyl group or tertiary butyl group), cyano group, aryl group (for example, a phenyl group, naphthyl group or thienyl group), haloaryl group (for example, a pentafluorophenyl group, 3-fluorophenyl group or 3,4,5-trifluorophenyl group), alkenyl group, alkynyl group, amide group, acyl group, alkylcarbonyl group, carboxy group, alkoxy group (for example, a methoxy group), aryloxy group (for example, a phenoxy group or naphthyl group), haloalkyl group (for example, a perfluoroalkyl group), thiocyano group, alkylsulfonyl group, sulfonamide group, amino group, alkylamino group (for example, a methylamino group), dialkylamino group (for example, a dimethylamino group or diethylamino group), hydroxyl group or polyethylene glycol group. A polyethyleneglycol group is a functional group represented by the following formula (2):

[Chemical Formula 3]

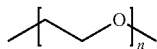

(2)

{where n is an integer of 1 to 1,300}. The symbol n in formula (2) is preferably an integer of 1 to 500 and more preferably an integer of 1 to 250.

The compound having a structure with multiple sulfur atoms bonded in succession may be a compound having a structure with multiple sulfur atoms bonded in succession in a part of the polymer backbone. The polymer backbone in this case may be any of the same backbones as the those mentioned for main backbones of polymers in the compound having an —SH group introduced into the main backbone of the polymer. Polyethylene glycol backbone, polyacetal backbone, polybutene backbone and polysulfide backbone are particularly preferred because they easily degrade. These may be used alone, or more than one may be used in admixture.

Specific examples of compounds having a structure with multiple sulfur atoms bonded in succession include 2,2'-dithiodiethanol, dimethyl trisulfide and bis(pentamethylene) thiuram tetrasulfide.

The number-average molecular weight of the sulfur atom-containing substance is not particularly restricted, but it is preferably no greater than 50,000 and more preferably no greater than 10,000. A compound with a number-average molecular weight exceeding 50,000 is more difficult to degrade, and the residue becomes a resistance component, increasing the resistance of the conductive film obtained. A compound with a number-average molecular weight of 10,000 or lower allows the sulfur concentration in the molecule to be more easily increased, and therefore the resistance of the conductive film obtained by the reducing effect of sulfur will be lower. The number-average molecular weight of the sulfur atom-containing substance is preferably 32 or greater.

The molecular weight of the low molecular weight compound can be measured by different methods of mass spectrometry (MS). For the high molecular weight compound, on the other hand, it can be measured by gel permeation chromatography (GPC). A low molecular weight is typically a molecular weight of less than 200, and a high molecular weight is typically a molecular weight of 100 or greater.

The measuring conditions for GPC may be the following, for example.
Pump: Waters616
RI detector: Shimadzu RID-10A
Autosampler: Shimadzu SIL-10Avp
Column: TSKgel G3000PWXI+G2500PWXI (7.8 mmIDx 30 cm)
Column temperature: 40° C.
Eluent: pH=3.5 phosphoric acid aqueous solution
Flow rate: 1.0 ml/min
Injection volume: 10 μl
Reference sample: Polyethylene oxide (Aldrich, PRODUCT No. 02393)

The mass ratio of sulfur atoms in the sulfur atom-containing substance is preferably 0.06 mass % or greater, more preferably 0.5 mass % or greater and even more preferably 3 mass % or greater. If the value is 0.06 mass % or greater, significant lowering of the resistance value will be seen. At 0.5 mass % or greater, the maximum lowering effect on the resistance value is seen. A compound with a sulfur atom mass ratio of 3 mass % or greater in the sulfur atom-containing substance exhibits an effect of lowering the resistance value of the obtained conductive film even with a small amount of addition in the dispersion. The mass ratio of the sulfur atom content in the sulfur atom-containing substance may be 100 mass % or lower. A compound with a sulfur atom content mass ratio in the sulfur atom-containing substance of 100 mass % is elemental sulfur. Elemental sulfur is also suitable as a sulfur atom-containing substance for this embodiment.

The content of the sulfur atom-containing substance in the dispersion of this embodiment is preferably $10^{-4}$ parts by mass or greater, more preferably 0.1 part by mass or greater and even more preferably 1 part by mass or greater, with respect to 100 parts by mass of the particles. The value is preferably 50 parts by mass or lower, more preferably 30 parts by mass or lower and even more preferably 20 or lower. If the content of the sulfur atom-containing substance is less than $10^{-4}$ parts by mass, a significant resistance-lowering effect of the obtained conductive film will not be seen;

if it is 0.1 part by mass or greater, the resistance-lowering effect can be maximized, especially by plasma treatment or flash lamp annealing treatment; and if it is 1 part by mass or greater, the resistance-lowering effect can be maximized by heat treatment. If the value exceeds 50 parts by mass, on the other hand, no significant resistance-lowering effect will be seen, because of resistance increase due to residue of the sulfur atom-containing substance.

The mass ratio of sulfur atoms in the high-boiling-point components and non-volatilizing components of the dispersion of this embodiment is preferably 0.003 mass % or greater, more preferably 0.025 mass % or greater and even more preferably 0.15 mass % or greater, with respect to the total of the high-boiling-point components and non-volatilizing components in the dispersion. The value is preferably 20 mass % lower, more preferably 10 mass % or lower and even more preferably 5 mass % or lower. The high-boiling-point components referred to here are the components with a vapor pressure of 0.010 Pa or higher and lower than 20 Pa at 20° C., and the non-volatilizing components are components with a vapor pressure of below 0.01 Pa at 20° C.

The sulfur atom-containing substance for this embodiment is most preferably an organic material with an —SH group, elemental sulfur, or a compound having a structure with multiple sulfur atoms bonded in succession, because their activity is high and their resistance-lowering effects are greater.

The sulfur element-containing substance in the dispersion can be identified and quantified by nuclear magnetic resonance (NMR), ultraviolet-visible spectroscopy (UV-Vis), infrared spectroscopy (IR), Raman spectroscopy, mass spectrometry (MS), elemental analysis, gel permeation chromatography (GPC), X-ray analysis, thermogravimetry or differential thermal analysis, for example. The mass ratio of sulfur atoms in the sulfur element-containing substance, and the mass ratio of sulfur atoms in the high-boiling-point components and non-volatilizing components of the dispersion, can each be quantified by elemental analysis. The content of the sulfur atom-containing substance in the dispersion can be quantified by GPC or thermogravimetry, for example. The —SH groups can be identified by NMR. Structures with sulfur element bonded in succession can be identified by Raman spectroscopy.

Before supplying the dispersion for analysis, the dispersion may be subjected to pretreatment. The method of pretreatment may be, for example, extraction, distillation, concentration, dilution, pH adjustment, acid addition, base addition, filtration, flocculant addition, heating, cooling, vacuum drying, buffer addition, ion-exchange, centrifugal separation or column chromatography. Any of such pretreatment methods may be carried out alone, or more than one may be combined for combination pretreatment. Such pretreatment allows isolation or separation of desired components in the dispersion.

[Other Components]

The dispersion of this embodiment contains the particles described above, and a dispersant or sulfur atom-containing substance, as its essential components. However, the dispersion of this embodiment may also contain other components in addition to these. Examples of such other components include surface energy modifiers, reducing agents (excluding the sulfur atom-containing substances mentioned above), organic binders and solvents. In addition to these, the dispersion of the second aspect may also contain a compound with a phosphate group.

(Compound with a Phosphate Group)

A compound with a phosphate group is preferably contained in the dispersion of the second aspect of this embodiment, wherein the dispersion of this embodiment contains the particles described above and sulfur atom-containing substance. In this case, the phosphate group adsorbs onto the copper atoms that are preferably present in the particles, preventing aggregation of the particles due to a steric hindrance effect.

The weight-average molecular weight Mw of the compound with a phosphate group is not particularly restricted but is preferably 300 to 30,000. If the weight-average molecular weight Mw of the compound with a phosphate group is lower than 300, the dispersion stability of the obtained dispersion will tend to be impaired. If the value is higher than 30,000, firing of the coated film will become difficult.

Specific examples of compounds with phosphate groups include the trade names "Disperbyk-142", "Disperbyk-145", "Disperbyk-110", "Disperbyk-111", "Disperbyk-180" and "Byk-9076" by Byk-Chemie Corp.;

and "PLYSURF M208F" and "PLYSURF DBS" by Dai-ichi Kogyo Seiyaku Co., Ltd. These may be used alone, or more than one may be used in admixture.

When the dispersion of this embodiment contains a compound with a phosphate group, its content is preferably 1 part by mass or greater, more preferably 5 parts by mass or greater and even more preferably 10 parts by mass or greater, with respect to 100 parts by mass of the particles. The value is preferably 100 parts by mass or less, more preferably 50 parts by mass or less and even more preferably 30 parts by mass or less, with respect to 100 parts by mass of the particles. If the content of the compound with a phosphate group is 1 part by mass or greater, the particles will not aggregate and adequate dispersibility will be obtained. If the content of the compound with a phosphate group exceeds 100 parts by mass, the resistance of the conductive film will be increased due to residue of the compound with the phosphate group.

(Surface Energy Modifier)

The dispersion of this embodiment may also contain a surface energy modifier for improved coatability. This improves the smoothness of the obtained coated film, when the dispersion is coated onto the blanket, yielding a more homogeneous conductive film.

Specific examples of surface energy modifiers include the trade names Triton X-45, Triton X-100, Triton X, Triton A-20, Triton X-15, Triton X-114, Triton X-405, Tween #20, Tween #40, Tween #60, Tween #80, Tween #85, Pluronic F-68, Pluronic F-127, Span 20, Span 40, Span 60, Span 80, Span 83, Span 85;

"SURFLON S-211", "SURFLON S-221", "SURFLON S-231", "SURFLON S-232", "SURFLON S-233", "SURFLON S-242", "SURFLON S-243" and "SURFLON S-611" by AGC Seimi Chemical Co., Ltd.;

"Novec FC-4430" and "Novec FC-4432" by 3M Co.; and

"MEGAFACE F-444" and "MEGAFACE F-558" by DIC Corp. Particularly preferred among these are fluorine-containing surfactants, with "SURFLON S-211", "SURFLON S-221", "SURFLON S-231", "SURFLON S-232", "SURFLON S-233", "SURFLON S-242", "SURFLON S-243" and "SURFLON S-611" by AGC Seimi Chemical Co., Ltd., "Novec FC-4430" and "Novec FC-4432" by 3M Co. and "MEGAFACE F-444" and "MEGAFACE F-558" by DIC Corp. being preferred. These may be used alone, or more than one may be used in admixture.

The amount of addition of the surface energy modifier in the dispersion of this embodiment is not particularly restricted, but is preferably 0.010 mass % or greater and more preferably 0.10 mass % or greater with respect to the total dispersion. The amount of addition of the surface energy modifier is also preferably no greater than 2.0 mass % and more preferably no greater than 1.5 mass % with respect to the total dispersion. If the surface energy modifier is contained at 0.010 mass % or greater, the film thickness of the obtained coated film will be homogeneous when the dispersion is coated, tending to help prevent coating unevenness. On the other hand, in order to obtain satisfactory conductivity without residue from the surface energy modifier in a conductive film obtained by firing the coated film, the amount of addition of the surface energy modifier is preferably no greater than 2.0 mass %.

(Solvent)

The dispersion of this embodiment may also contain a solvent to adjust the viscosity and improve the coatability.

The solvent used for the dispersion of this embodiment may be any of various solvents depending on the purpose of use of the dispersion. For example, for purposes that require high smoothness it is preferred to use a high-boiling-point solvent, and for purposes that require a quick-drying property it is preferred to use a low-boiling-point solvent.

The vapor pressure of the low-boiling-point solvent at 20° C. is preferably 20 Pa or higher and 150 hPa or lower, more preferably 100 Pa or higher and 100 hPa or lower, and even more preferably 300 Pa or higher and 20 hPa or lower. The vapor pressure is preferably 150 hPa or lower in order to maintain a high volatilization rate of the solvent and ensure dispersion stability of the particles in the dispersion. On the other hand, the vapor pressure is preferably 20 Pa or higher for a drying speed that does not allow cracks to form in the dispersion-coated film.

Specific examples of low-boiling-point solvents that may be used include water, ethyl acetate, normal-propyl acetate, isopropyl acetate, pentane, hexane, cyclohexane, methylcyclohexane, toluene, methyl ethyl ketone, methyl isobutyl ketone, dimethyl carbonate, methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, phenol, cyclohexanol, methylcyclohexanol 3,3,5-trimethylcyclohexanol, benzyl alcohol and diacetone alcohol. In order to avoid swelling of the blanket during reverse printing and increase the usable life of the blanket, the solvent is preferably a hydrophilic solvent, and more preferably a mixed solvent comprising water and a monoalcohol of 10 or fewer carbon atoms. Among monoalcohols of 10 or fewer carbon atoms there are more preferred one or more selected from the group consisting of ethanol, n-propanol, i-propanol, n-butanol, i-butanol, sec-butanol and t-butanol, because the dispersibility, volatility and viscosity are particularly suitable. These monoalcohols may each be used alone, or more than one may be used in admixture. If the number of carbon atoms of the monoalcohol is greater than 10 the dispersibility of the particles may be reduced, and therefore the number of carbon atoms of the monoalcohol is preferably 10 or fewer.

The vapor pressure of the high-boiling-point solvent at 20° C. is preferably 0.010 Pa or higher and lower than 20 Pa, more preferably 0.05 Pa or higher and lower than 16 Pa, and even more preferably 0.1 Pa or higher and lower than 14 Pa. In order to maintain the smoothness of the dispersion-coated film by a leveling effect, the vapor pressure is preferably lower than 20 Pa. On the other hand, the vapor pressure is preferably 0.010 Pa or higher in order to allow easy removal by the firing treatment described below, and to minimize inclusion of the solvent residue that has not been fully removed in the obtained conductive film, and impairment of the conductivity which may result.

Specific examples of high-boiling-point solvents include propyleneglycol monomethyl ether acetate, 3methoxy-3-methyl-butyl acetate, ethoxyethyl propionate, propyleneglycol monomethyl ether, propyleneglycol monoethyl ether, propyleneglycol monopropyl ether, propyleneglycol tertiary butyl ether, dipropyleneglycol monomethyl ether, ethyleneglycol butyl ether, ethyleneglycol ethyl ether, ethyleneglycol methyl ether, xylene, mesitylene, ethylbenzene, octane, nonane, decane, ethylene glycol, 1,2-propylene glycol, 1,3-butylene glycol, 2-pentanediol, 2-methylpentane-2,4-diol, 2,5-hexanediol, 2,4-heptanediol, 2-ethylhexane-1,3-diol, diethylene glycol, dipropylene glycol, hexanediol, octanediol, triethylene glycol, tri-1,2-propylene glycol and glycerol. In order to avoid swelling of the blanket during reverse printing and increase the usable life of the blanket, the solvent is preferably a hydrophilic solvent, and more preferably a polyhydric alcohol of 10 or fewer carbon atoms. These polyhydric alcohols may each be used alone, or more than one may be used in admixture. If the number of carbon atoms of the polyhydric alcohol is greater than 10, the dispersibility of microparticles may be reduced.

A low-boiling-point solvent and high-boiling-point solvent may also be used in admixture.

The amount of solvent used may be selected depending on the coating method.

For example, when the dispersion of this embodiment is to be applied for ink jet printing, the total content of the high-boiling-point components and non-volatilizing components in the dispersion is preferably an amount for 1 to 40 mass % and more preferably an amount for 10 to 20 mass %. If the value is 1 mass % or greater, the film thickness of the coated film will be sufficiently large, and it will be possible to form conductive high copper wiring by firing treatment. If the value is 40 mass % or less, the viscosity of the dispersant can be adjusted to a range suitable for ink jet printing, and if it is 20 mass % or less, clogging of the printing head of the ink jet printer can be prevented.

When the dispersion of this embodiment is to be applied for screen printing, the total content of the high-boiling-point components and non-volatilizing components in the dispersion is preferably an amount for 40 to 90 mass % and more preferably an amount for 60 to 85 mass %.

When the dispersion of this embodiment is to be applied for reverse printing, the total content of the high-boiling-point components and non-volatilizing components in the dispersion is preferably an amount for 5 to 60 mass % and more preferably an amount for 10 to 30 mass %.

[Preparation of Dispersion]

The dispersion can be prepared by mixing and dispersing the aforementioned particles, dispersant, and other optionally added components, each in prescribed proportions. The dispersion treatment may be carried out with a suitable apparatus using an ultrasonic method, mixer method, triple roll method, two roll method, attritor, Banbury mixer, paint shaker, kneader, homogenizer, ball mill or sand mill.

In preparation of the dispersion of this embodiment, appropriately setting the concentrations of the aforementioned particles and dispersant, and the optionally added solvent, surface energy modifier and other components, will allow adjustment of the viscosity and surface energy of the dispersion that is obtained.

There are no particular restrictions on the viscosity of the dispersion of this embodiment at 25° C., but it is preferably no greater than 100 mPa·s and even more preferably no greater than 30 mPa·s, in the region where the shear rate is $1\times10^{-1}$ $s^{-1}$ to $1\times10^{2}$ $s^{-1}$, as measured using a cone-plate rotating viscosimeter. The viscosity at 25° C. is preferably no greater than 100 mPa·s, for easy formation of a homogeneous coated film during printing.

There are no particular restrictions on the surface free energy of the dispersion of this embodiment at 25° C., but it is preferably no greater than 40 mN/m, more preferably no greater than 35 mN/m and even more preferably no greater than 30 mN/m. In reverse printing as described below, the surface free energy at 25° C. is preferably no greater than 40 mN/m, from the viewpoint of wettability of the dispersion on a blanket. The surface free energy can be measured using a contact angle meter.

[Conductive Film Forming Method]

The dispersion of this embodiment can be coated (printed) onto a substrate and subjected to firing treatment to form conductive wiring comprising a conductive film with a prescribed pattern.

The method of forming a conductive film of this embodiment includes:

a step of coating a dispersion of this embodiment onto a base material to form a coated film, and a step of heated firing of the coated film.

The method of forming a conductive film according to this embodiment will now be described in detail.

(Base Material)

The base material to be used in the method of forming a conductive film according to this embodiment may be, instead of a common printed board, a resin base material, glass base material, silicon wafer or paper base material. A common printed board is a paper-phenol substrate, paper-epoxy substrate, glass composite substrate, glass-epoxy substrate, TEFLON substrate, alumina substrate or low temperature co-fired ceramic (LTCC) substrate.

Examples of resin base materials that may be used include base materials made of polyimide, polyethylene terephthalate (PET), polyether sulfone (PES), polyethylene naphthalate (PEN), polyester, polycarbonate (PC), polyvinyl alcohol (PVA), polyvinyl butyral (PVB), polyacetal, polyallylate (PAR), polyamide (PA), polyamideimide (PAI), polyetherimide (PEI), polyphenylene ether (PPE), polyphenylene sulfide (PPS), polyetherketone (PEK), polyphthalamide (PPA), polyethernitrile (PEN), polybenzimidazole (PBI), polycarbodiimide, polysiloxane, polymethacrylamide, nitrile rubber, acrylic rubber, polyethylene tetrafluoride, epoxy resins, phenol resins, melamine resins, urea resins, polymethyl methacrylate resin (PMMA), polybutene, polypentene, ethylene-propylene copolymer, ethylene-butene-diene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyetheretherketone (PEEK), phenol-novolac, benzocyclobutene, polyvinylphenol, polychloroprene, polyoxymethylene, polysulfone (PSF), cycloolefin polymer (COP) and silicone resin. PET and PEN, being readily available at low cost, are particularly significant and preferred from a business viewpoint.

The thickness of the base material may be 1 µm to 10 mm, for example, and is preferably 25 µm to 250 µm. The thickness of the base material is preferably 250 µm or smaller, because the electronic device that is fabricated will be able to be rendered lightweight, compact and flexible.

(Pretreatment of Base Material)

The base material may be subjected to cleaning before formation of the coated film. The method of cleaning the base material may be, for example, wet processing using a chemical solution, or dry processing using corona discharge, plasma, UV or ozone.

(Coated Film Forming Method)

There are no particular restrictions on the method of forming a coated film on a base material as described above using a dispersion of this embodiment. The method used may be, for example, a method such as screen printing, spray coating, spin coating, slit coating, die coating, bar coating, knife coating, offset printing, reverse printing, flexographic printing, ink jet printing, dispenser printing, gravure direct printing or gravure offset printing. Of these methods, reverse printing is preferred from the viewpoint of allowing more high definition patterning to be accomplished.

(Reverse Printing)

The dispersion of this embodiment can be most suitably used for formation of a patterned coated film on a substrate by reverse printing.

In a reverse printing method, first a coated film with uniform thickness is formed on the surface of a blanket.

The blanket surface is usually composed of silicone rubber. In reverse printing, it is necessary for the dispersion to satisfactorily adhere to the silicone rubber and form a homogeneous coated film. Therefore, the viscosity and surface free energy of the dispersion of this embodiment are preferably selected to be within the ranges specified above.

Next, the surface of the blanket, on whose surface the homogeneous dispersion coating film has been formed in this manner, is contacted with and pressed against a relief printing plate, and part of the coated film that has been formed on the blanket surface is caused to adhere and be transferred onto the surfaces of the protruding sections of the relief printing plate. As a result, the desired printing pattern is formed on the coated film remaining on the surface of the blanket.

The blanket in this state is pressed against the surface of the base material that is to be printed, and the patterned coated film remaining on the blanket is transferred to it, thereby forming a patterned coated film on the base material to be printed.

(Film Thickness of Coated Film)

The film thickness of the coated film may be selected depending on the coating method.

For example, the film thickness of the coated film for application of ink jet printing is preferably 0.1 to 10 µm and more preferably 0.5 to 5 µm, as the value after removal of the solvent.

For application of screen printing, the coated film thickness value after removal of the solvent is preferably 1 to 100 µm and more preferably 10 to 50 µm.

For application of reverse printing, the coated film thickness value after removal of the solvent is preferably 0.01 to 5 µm and more preferably 0.1 to 1 µm.

The surface roughness (Ra) of the coated film is preferably 12 nm or lower, more preferably 7 nm or lower and even more preferably 4 nm or lower. If the Ra is 12 nm or lower, the coated film will firmly bond with the removal plate during reverse printing, tending to result in adequate removability. If the Ra is 7 nm or lower, a flat membrane surface will tend to be maintained even in the conductive film that is obtained. If the Ra is 4 nm or lower, firing irregularities will be extremely minimal and homogeneous electrical characteristics will tend to be obtained.

When the coated film formed as described above contains a solvent, preferably the solvent is subsequently removed from the coated film. Removal of the solvent may be carried out by a method of allowing the coated film to stand at 20 to 150° C., for example, for 1 minute to 2 hours, for example. The heating method in this case may be a method of hot air drying, infrared ray drying or vacuum drying, for example.

(Coated Film)

The coated film formed by coating the dispersion of this embodiment contains:

particles selected from among metallic particles and metal oxide particles, and a dispersant, when a dispersion of the first aspect has been used, the dispersant containing a low-molecular-weight dispersant that has at least one peak within a molecular weight region of 31 or greater and less than 1,000, and a high-molecular-weight dispersant that has at least one peak within a molecular weight region of 1,000 or greater and 40,000 or less, in the molecular weight distribution curve in terms of polyethylene glycol, as determined by gel permeation chromatography; or when a dispersion of the second aspect has been used, particles containing one or more selected from the group consisting of copper and copper oxides, and one or more sulfur atom-containing substances selected from the group consisting of compounds with an —SH group, elemental sulfur and compounds having a structure with multiple sulfur atoms bonded in succession.

These films preferably contain the components other than the solvent, among the components in the dispersion used for coating, in a manner that maintains their chemical structures and compositional ratios. Thus, the constituent components of the film preferably correspond directly to the constituent components of the dispersion described above.

The coated film of this embodiment is preferably bendable. The bendable curvature radius is preferably no greater than 1,000 mm, more preferably no greater than 500 mm and even more preferably no greater than 100 mm. A value of 1,000 mm or smaller will allow fitting to the human torso, a value of 500 mm or smaller will allow fitting to human legs, and a value of 100 mm or smaller will allow fitting to human upper extremities, while also allowing application of roll-to-roll production methods.

The lower limit for the curvature radius may be 0.1 mm, for example.

(Heated Firing)

The coated film that has been formed as described above may then be fired by heating to form a conductive film on the base material.

The heated firing method for production of a conductive film according to this embodiment is not particularly restricted so long as it is a method allowing the particles in the coated film to be fused to form a sintered film of the metal microparticles.

Firing in the method for producing an conductive film according to the invention may be carried out, for example, by a method using the heating medium of a firing furnace, or using plasma, ultraviolet rays, vacuum ultraviolet rays, an electron beam, infrared lamp annealing, flash lamp annealing, or a laser. Of these, plasma treatment, flash lamp annealing treatment and contact treatment with a heating medium are preferred.

In particular, it is a feature of flash lamp annealing treatment and plasma treatment that inorganic materials are strongly heated while organic materials are hardly heated. Heating by these methods heats only the particles, producing no heat damage in the base material. Thus, resins that are inexpensive but have poor heat resistance, such as PET, can be used as the base material, and are preferred. Plasma treatment is more particularly preferred because only the inorganic material surface tends to be heated, and damage to the base material by heat transfer is also lessened.

(Heating by Contact with Heating Medium)

When the heated firing of this embodiment is by contact with a heating medium, firing of the coated film is preferably carried out in a non-oxidizing atmosphere in order to avoid oxidizing the conductive film obtained after the heated firing. When the particles in the dispersion include a metal oxide, firing of the coated film is preferably carried out in a reducing atmosphere, in order to promote reduction of the metal oxide and minimize resistance of the obtained conductive film.

A non-oxidizing atmosphere is an atmosphere containing no oxidizing gas such as oxygen. The non-oxidizing atmosphere may be an inert atmosphere or a reducing atmosphere. An inert atmosphere is an atmosphere filled with an inert gas, such as argon, helium, neon or nitrogen, for example. A reducing atmosphere is an atmosphere containing a reducing gas such as hydrogen or carbon monoxide.

The gas may be filled into a firing furnace and the dispersion-coated film fired as a sealed system. The firing furnace may also be a circulating system with the gas flowing while firing the dispersion-coated film. When the dispersion-coated film is to be fired in a non-oxidizing atmosphere, preferably the firing furnace is first brought to a vacuum to remove the oxygen in the firing furnace, and then exchange is performed with a non-oxidizing gas.

Contact treatment with a heating medium may be carried out in a pressurized atmosphere or in a reduced pressure atmosphere.

(Heating by Plasma Treatment)

Plasma treatment for this embodiment is, specifically, treatment in which plasma is generated in the space in which the sample is set, thus exposing the sample to the plasma.

There are no particular specifications for generating the plasma, and for example, methods utilizing direct current arc discharge, high-frequency electromagnetic fields or microwaves may be used. Methods utilizing microwaves are particularly preferred because they can generate plasma at low temperature, thereby reducing heat damage in the base material. Microwaves are, specifically, electromagnetic waves in the frequency range from 300 MHz to 3 THz. The center frequency of the microwaves is preferably from 2 GHz to 4 GHz, and more preferably from 2.4 GHz to 2.5 GHz.

The apparatus used to generate the microwave plasma is composed of a microwave oscillator, a transmission line, an antenna and a discharge container, for example. In addition to these, a magnetic field generator may also be used if necessary. In the apparatus, the plasma is generated inside the discharge container. Examples of microwave oscillators that may be used include klystrons, magnetrons and gyrotrons. Examples of transmission lines that may be used include rectangular waveguides, circular waveguides and coaxial lines. Along the transmission line there may be installed a power monitor, and a dummy load to absorb reflective electric power. The apparatus structure is preferably one having a transmission line at the top and a discharge container at the bottom, with the transmission line and discharge container connected via a quartz window, and the sample stage set at the lower part of the discharge container, for example.

There are no particular specifications for the output of the microwaves, but it is preferably an output of 100 W to 3 kW. The microwave output may be constant during the treatment, or it can be varied throughout.

There are no particular specifications on the temperature of the sample stage but it is preferably between 30° C. and 150° C. If the temperature is 150° C. or below, a common resin substrate with low heat resistance, such as PET, may be used as the base material. If it is 30° C. or higher, a dense conductive film can be obtained.

There are no particular specifications on the ambient atmosphere during plasma treatment, but it is preferably a reducing atmosphere. The ambient atmosphere may be controlled by introducing a suitable gas into the discharge container, for example. There are no particular specifications on the gas flow rate, but it is preferably 10 SCCM or higher and 1,000 SCCM or lower, more preferably 50 SCCM or higher and 5,600 SCCM or lower, and even more preferably 100 SCCM or higher and 400 SCCM or lower. It is particularly preferred to form a reducing atmosphere by introducing a mixed gas comprising a mixture of a small amount of hydrogen with an inert gas. Examples for the inert gas in such a mixed gas that may be used include nitrogen; and noble gases such as helium and argon. The hydrogen content of the mixed gas is preferably between 0.1 mass % and 10 mass %, inclusive, and more preferably between 2 mass % and 6 mass %, inclusive.

The pressure in the discharge container may be atmospheric pressure, or it may be reduced pressure.

There are no particular specifications for the plasma treatment time, but it is preferably 10 seconds to 30 minutes, more preferably 30 seconds to 10 minutes and even more preferably 1 minute to 5 minutes.

(Heating by Flash Lamp Annealing)

Flash lamp annealing for this embodiment is treatment in which the sample is subjected to pulse irradiation with light of high energy density to heat the sample.

The light source used in flash lamp annealing may be a xenon lamp or krypton lamp, for example.

The wavelength of the light source is preferably in the visible light range, since this will allow the coated film to be fired without incurring heat damage in the transparent resin base. The wavelength of the light source can be easily controlled through a color filter.

There are no particular specifications for the energy per pulse, but it is preferably 50 J to 3,000 J, more preferably 100 J to 2,000 J and even more preferably 150 J to 1,500 J.

There are also no particular specifications for the pulse time, but it is preferably 10 μsec to 100 msec, more preferably 50 μsec to 10 msec and even more preferably 100 μsec to 5 msec. The pulse time referred to here is the time from the time point at which electric power is introduced to the lamp for pulsed light irradiation, until the time point at which electric power supply to the lamp is interrupted for pulsed light termination.

The sample may also be irradiated with pulsed light several times. There are no particular specifications for the pulse interval, but it is preferably 10 μsec to 1 second. The pulse interval is the time from the time point at which electric power is introduced to the lamp for irradiation of the pulsed light, until the time point at which electric power has been introduced to the lamp for the next pulsed light irradiation.

There are no particular specifications on the temperature of the sample stage but it is preferably between 30° C. and 150° C. If the temperature is 150° C. or below, a common resin substrate with low heat resistance, such as PET, may be used as the base material. If it is 30° C. or higher, a dense conductive film can be obtained.

A gas may be introduced into the container during the flash lamp annealing. In this case, the sample is cooled by the gas flow, allowing heat damage to the base material to be reduced.

There are no particular specifications on the ambient atmosphere during flash lamp annealing, but it is preferably a reducing atmosphere. The specific examples and gas flow rate for the reducing atmosphere are the same as mentioned above for the reducing atmosphere during plasma treatment.

Pressurizing treatment may be carried out after flash lamp annealing. Pressurization of the sample after flash lamp annealing is preferred since it allows the formed conductive film to be rendered even more dense. The pressurizing method may employ a roller press or flat press, for example. A roller press is particularly suited for large-area pressing, and is therefore preferred.

[Advantages of the Method of this Embodiment]

The method of this embodiment allows direct writing of the dispersion of this embodiment on base materials in desired patterns, to form patterned coated films and conductive films. Therefore, productivity can be drastically improved compared to methods using conventional photoresists.

Moreover, with the method of this embodiment it is possible to easily produce conductive film laminates with diameters of 7 inches or larger, which have has been difficult to fabricate by conventional photolithography.

[Conductive Film]

The conductive film obtained by the method of this embodiment can have a surface roughness (Ra) of 20 nm or lower, 10 nm or lower or 5 nm or lower. If the Ra is 20 nm or lower, there will be few locations of small local film thickness, and defects due to wire breakage can be reduced. If the Ra is 10 nm or lower, defects will be less likely to occur when another film or element is further layered on the conductive film. If the Ra is 5 nm or lower, the crystallinity of other materials further layered on the conductive film can be increased, thus allowing suitable use for formation of a thin-film transistor electrode, for example.

The resistivity of a conductive film of this embodiment is preferably no greater than 200 μΩcm, more preferably no greater than 100 μΩcm and even more preferably no greater than 30 μΩcm.

The conductive film of this embodiment is preferably bendable. The bendable curvature radius is preferably no greater than 1,000 mm, more preferably no greater than 500 mm and even more preferably no greater than 100 mm. A value of 1,000 mm or smaller will allow fitting to the human torso, a value of 500 mm or smaller will allow fitting to human legs, and a value of 100 mm or smaller will allow fitting to human upper extremities, while also allowing application of roll-to-roll production methods.

The conductive film of this embodiment contains at least a metal, a metal oxide and an organic material. When the conductive film is divided in half in the thickness direction, one of the side halves has a higher metal concentration while the other has a higher concentration of the metal oxide and organic material. Since the side with the higher metal concentration is on the outer surface side of the conductive film (the side opposite from the side in contact with the substrate), the conductive film of this embodiment exhibits high conductivity.

In a preferred mode of this embodiment, the conductive film is a two-layer film comprising a surface layer composed mainly of a metal layer, and a lower layer with fine pores.

The surface layer may be a dense metal layer, or it may be a metal layer including fine pores. A dense metal layer is preferred for exhibiting high conductivity. A metal layer including fine pores is preferred, being lightweight and flexible and therefore less likely to break. Since the metal layer including fine pores can be formed with a large surface area, it has the advantage of permitting increased adhesiveness with various laminating materials. Consequently, the soldering strength can be increased, or the film can be used as a chemical sensor that utilizes adsorption/desorption onto surfaces and oxidation-reduction of surfaces.

The lower layer of the conductive film is assumed to be one having a construction similar to the coating film before heated firing.

The ratio of the thicknesses of the surface layer and the lower layer can be controlled by the conditions during heated firing of the coating film. Specifically, a higher heating temperature, a longer heating time and a higher exposure energy intensity of the plasma or flash lamp can increase the surface layer thickness ratio.

The relative element concentration of the metal in the surface layer is preferably 70% or greater, more preferably 80% or greater and even more preferably 85% or greater, and it may even be 100%. Satisfactory conductivity can be exhibited if the metal element in the surface layer is present at 50% or greater, and high conductivity can be obtained if it is present at 80% or greater.

The relative element concentration of oxygen from the metal oxide in the surface layer is preferably 20% or lower, more preferably 15% or lower and even more preferably 10% or lower, and it may even be 0%.

The relative element concentration of the metal in the lower layer is preferably 20% or higher, more preferably 50% or higher and even more preferably 75% or higher; and preferably 95% or lower, more preferably 90% or lower and even more preferably 85% or lower. If the value is 20% or higher, high adhesiveness with the surface layer can be obtained, and if it is 90% or lower, high adhesiveness with the base material can be obtained.

The relative element concentration of oxygen from the metal oxide that is in the lower layer is preferably 1% or higher, more preferably 5% or higher and even more preferably 10% or higher; and preferably 50% or lower, more preferably 30% or lower and even more preferably 20% or lower. If the value is 1% or higher, adhesiveness with the base material will increase. If the value is 50% or lower, adhesiveness with the highly conductive surface layer will increase.

The relative element concentration of fluorine in the conductive film is preferably 0.1% or higher, more preferably 0.5% or higher and even more preferably 1% or higher; and preferably 5% or lower, more preferably 3% or lower and even more preferably 2% or lower. If the conductive film contains hydrophobic fluorine at 0.1% or higher, corrosion of the metal due to water can be prevented. However, a fluorine content of 5% or higher may lower the conductivity. The range specified above is preferred in consideration of these factors. The relative element concentration of fluorine is the value for the conductive film as a whole.

The relative element concentrations in the conductive film can be measured by various elemental analysis methods. Examples of elemental analysis methods include Inductively Coupled Plasma Atomic Emission Spectroscopy (ICP-AES), Inductively Coupled Plasma Mass Spectrometry (ICP-MS), Secondary Ion Mass Spectrometry (SIMS), Time-Of-Flight Secondary Ion Mass Spectrometry (TOF-SIMS), Energy Dispersive X-ray analysis (EDX), Glow Discharge Mass Spectrometry (GDMS), Rutherford Backscattering Spectroscopy (RBS) and X-ray Photoelectron Spectroscopy (XPS). XPS is particularly preferred in order to also obtain information regarding the binding states of atoms. The relative element concentration referred to here is the value of the proportion of the element with respect to all of the elements in the film with the exclusion of hydrogen and helium, and it is expressed as atomic %. The following is an example of conditions for XPS measurement.
Device used: PHI5000 VersaProbe II by Ulvac-Phi, Inc.
Excitation source: Monochromatized Al Kα 15 kV×3.3 mA
Photoelectron take-off angle: 45°
Pass Energy: 117.4 eV (Survey scan), 23.5 eV (Narrow scan)

The relative sensitivity coefficient used for converting the measured value to a relative element concentration may be the value indicated in the device manual. The following are examples of relative sensitivity coefficients.
C 1s: 0.314
O 1s: 0.733
F 1s: 1.000
Cu 2p3/2: 2.626

By conducting the XPS measurement after etching of the surface to be measured, it is possible to measure the relative element concentration in the interior to be measured. The etching method may be wet etching using a chemical solution that can dissolve or corrode the target of measurement; or dry etching using reactive gas, ions, radicals or a laser.

Ions or radicals to be used in dry etching may be produced by a laser, microwaves, glow discharge, arc discharge or corona discharge, for example. The generated ions may be supplied to etching after being accelerated by an acceleration voltage. The high energy ions that have been accelerated may be impacted with the sample surface for sputtering of the sample.

Examples of dry etching apparatuses include UV-ozone cleaning apparatuses, plasma cleaning apparatuses, corona discharge apparatuses, sputtering apparatuses, reactive ion etching apparatuses, ion beam apparatuses, focused ion beam apparatuses, gas cluster ion beam apparatuses, nanosecond pulse laser apparatuses and femtosecond pulse laser apparatuses.

The following is an example for the etching conditions.
Device used: PHI5000 VersaProbe II by Ulvac-Phi, Inc.
Ion species: Argon monomer ion
Acceleration voltage: 2 kV
Raster range: 2 mm 4-way
Sputtering interval: 1 minute
Sample current: 1.36 µA By carrying out etching and elemental analysis either alternately or simultaneously, it is possible to acquire the relative element concentration profile in the thickness direction of the film. The etching and elemental analysis are preferably carried out in a vacuum. If the etching and elemental analysis are carried out in air, the specimen surface exposed by etching will be fouled or altered by atmospheric exposure, thus interfering with accurate analysis. Examples of methods of continuous etching and elemental analysis in a vacuum include methods combining SIMS and sputtering with XPS, AES or TOF-SIMS. Of these, a combination of sputtering and XPS is particularly preferred.

The relative element concentration profile in the thickness direction can be satisfactorily ascertained, for example, using a PHI5,000 VersaProbeII by Ulvac-Phi, Inc. as the apparatus, with the XPS measuring conditions and etching conditions described above.

A region of about 5 nm from the outer surface of the conductive film has the property of being easily oxidized after firing, and readily adsorbing organic materials in the atmosphere. Consequently, the data used to represent the surface layer are preferably data for the deep layer of at least 5 nm from the outer surface.

The conductive film of this embodiment has strong bonding between the base material and the lower layer, and between the lower layer and the upper layer, and therefore exhibits high adhesiveness.

[Application Examples of the Invention]

As explained above, according to this embodiment it is possible to obtain a highly smooth conductive film having a micronized pattern. The conductive film can be satisfactorily utilized in a printed board, flexible printed board, electromagnetic shield sheet, semiconductor device (thin-film transistor, diode or ferroelectric memory) or metal mesh transparent conductive film, for example.

Application of this embodiment to a metal mesh transparent conductive film will now be explained.

A metal mesh transparent conductive film is one having a metal wiring with a width of 50 µm or smaller formed in a mesh-like manner on a transparent base material. The metal mesh transparent conductive film has the feature of being apparently transparent but with low electrical resistance on the surface. Since a structure having a width of 50 µm or smaller is poorly visible, the metal wiring of a metal mesh transparent conductive film appears not to be present on the base material. The regions where the metal wiring are absent (the openings) transmit light. Therefore a metal mesh transparent conductive film is visible as a transparent body.

The dispersion of this embodiment can be satisfactorily utilized as a material to form wirings on metal mesh transparent conductive films.

When the dispersion of this embodiment is applied for wiring formation on a metal mesh transparent conductive film, the proportion of the area of the openings of the metal mesh transparent conductive film occupying the entire area of the surface of the conductive film is preferably 50% or greater, more preferably 80% or greater and even more preferably 90% or greater. If the proportion is 50% or greater, the metal mesh transparent conductive film will be recognizable as a transparent body; if it is 80% or greater, reflection of ambient light will be reduced when the metal mesh transparent conductive film is used in a display, making the screen adequately recognizable even outdoors; and if it is 90% or greater, glare can be attenuated when the metal mesh transparent conductive film is used in a display. The width of the wiring is preferably 50 µm or smaller, more preferably 10 µm or smaller and even more preferably 2 µm or smaller. If the width is 50 µm or smaller, the metal mesh transparent conductive film will be recognizable as a transparent body; if it is 10 µm or smaller, it will be possible to obtain sufficient light transmittance and mesh density for use in a transparent conductive film for a touch panel; and if it is 2 µm or smaller, it will be possible to form a highly uniform electric field on the mesh.

The dispersion of this embodiment can be suitably used, for example, to form wiring on a metal mesh transparent conductive film in a liquid crystal display, organic EL display or electronic paper common electrode; or a light extraction electrode for organic EL illumination.

Application of this embodiment to a thin-film transistor will now be explained.

A thin-film transistor is an electronic device comprising a gate electrode, gate insulating film, semiconductor, source electrode and drain electrode, which are laminated. The dispersion of this embodiment can be suitably used as a material to form a gate electrode, source electrode or drain electrode.

The source electrode-drain electrode distance (channel length) is preferably 50 µm or smaller, more preferably 10 µm or smaller and even more preferably 2 µm or smaller. A smaller channel length will increase the operating frequency of the thin-film transistor.

EXAMPLES

The present invention will now be explained in more specific detail through the following examples, with the understanding that the invention is in no way limited to the examples.

The dispersions obtained in Comparative Examples 1-1 to 1-10 and Examples 1-1 to 1-16 described below were each evaluated in the following manner.
(1) Dispersibility of Dispersion The obtained dispersion was visually observed to determine the degree of turbidity, and was evaluated on the following scale. When microparticle aggregates were present in the dispersion sample, the evaluation was an evaluation utilizing the phenomenon of turbidity of the sample by light scattering.

No turbidity, homogeneous: A (Good dispersibility)
Slight turbidity seen: B (dispersible)
Significant turbidity, non-homogeneous: C (Poor dispersibility)
(2) Long-Term Storage Stability of Dispersion The obtained dispersion was allowed to stand at 25° C. while encapsulated in a glass container, and the time (days) until formation of a precipitate was investigated. The precipitate is assumed to be generated by reaggregation of the microparticles.
(3) Formation of Coating Film The obtained dispersion was used to form an L/S=5 µm/5 µm pattern on a PET film (A4300 by Toyobo, Ltd.), by reverse printing according to the following procedure.

The dispersion was evenly coated onto a PDMS smooth surface, which was to serve as the blanket release surface, with a bar coater to a dry film thickness of approximately 400 nm, and was naturally dried for about 1 minute to obtain a coated film. Next, a removal plate was pressed against the dispersion-coated film on the blanket, and then separated to remove the unwanted portions of the coated film. The PET film was then pressed onto the blanket to transfer the pattern formed on the blanket onto the PET film.
(4) Evaluation of Fine Printing Property The shape of the pattern obtained in (3) above was observed using an optical microscope and evaluated on the following scale.

L/S=5 µm/5 µm pattern formed: A (satisfactory fine printing property)

L/S=5 µm/5 µm pattern contained removal defects or transfer defects: C (poor fine printing property)
(5) Surface Roughness of Formed Pattern The surface roughness of the pattern obtained in (3) was measured using a "VertScan" white interferometer by Ryoka Systems, Inc.
(6) Formation of conductive films (Comparative Examples 1-1 and 1-6, and Example 1-1)

A microwave plasma furnace was used to introduce process gas (3 vol % hydrogen, 97 vol % helium) into a vacuum chamber at a flow rate of 300 sccm, while firing the print pattern obtained in (3) above for 5 minutes with an output of 1.5 kW, to obtain a conductive film with a thickness of 0.2 µm. The dimensional change factor of the obtained film was less than 0.05%, and no noticeable deformation such as wrinkles were seen.
(7) Volume Resistivity of Conductive Film The volume resistivity of the conductive film obtained in (6) above was measured using a LORESTA GP low resistivity meter by Mitsubishi Chemical Corp. The measurement results are shown in Table 2.

Comparative Example 1-1

In a mixed solvent of 800 g of water and 400 g of 1,2-propylene glycol (Wako Pure Chemical Industries, Ltd.) there was dissolved 80 g of copper(II) acetate monohydrate (Wako Pure Chemical Industries, Ltd.), and then 24 g of hydrazine (Wako Pure Chemical Industries, Ltd.) was added, the mixture was stirred, and the supernatant and precipitate were separated by centrifugation. To 0.3 g of the obtained precipitate (1) there were added 0.040 g of poly(ethylene glycol) methyl ether thiol with a number-average molecular weight of 800 (Aldrich Co.) as a dispersant and 0.66 g of n-butanol (Wako Pure Chemical Industries, Ltd.) as a solvent, and a homogenizer was used for dispersion to obtain a dispersion for Comparative Example 1 containing copper (I) oxide particles.

The mean secondary particle size of the particles in the dispersion of Comparative Example 1 was 35 nm.

Comparative Examples 1-2 to 1-10 and Examples 1-1 to 1-12

Dispersions for Comparative Examples 1-2 to 1-10 each containing copper(I) oxide particles were obtained by the same procedure as Comparative Example 1-1, except for changing the type and amount of the dispersant and the type and amount of the solvent added to 0.3 g of precipitate (1), as shown in Table 1. For each of Examples 1-1 to 1-12, a mixture comprising two different components was used as the dispersant.

The mean secondary particle sizes of the particles in the dispersions, and the results of the evaluations conducted by the methods described above, are also shown in Table 1.

For Examples 1-1 to 1-12, each of the obtained dispersions were measured by GPC, and in the molecular weight distribution curve in terms of polyethylene glycol, a peak was detected in both the molecular weight region of 31 or greater and less than 1,000 and the molecular weight region of 1,000 or greater and 40,000 or less.

Example 1-13

To 0.20 g of silver nanopowder with a particle size of <150 nm (product name: "Silver nanopowder, particle size: <150 nm, 99% trace metal basis", product of Aldrich) there were added a mixture of 0.010 g of poly(ethylene glycol) methyl ether thiol with a number-average molecular weight of 6,000 (product of Aldrich Co.) and 0.030 g of poly(ethylene glycol) methyl ether thiol with a number-average molecular weight of 800 (product of Aldrich Co.), as a dispersant, and 0.76 g of distilled water as a solvent, and a homogenizer was used for dispersion to obtain a dispersion for Example 1-13 containing silver particles.

The mean secondary particle size of the microparticles in the dispersion of Example 1-13 was 521 nm.

Examples 1-14 to 1-16

Dispersions for Examples 1-14 to 1-16 each containing silver particles were obtained by the same procedure as Example 1-13, except for changing the type and amount of each component in the dispersant mixture, as shown in Table 1.

Each of the dispersions obtained in Examples 1-13 to 1-16 were measured by GPC, and in the molecular weight distribution curve in terms of polyethylene glycol, a peak was detected in both the molecular weight region of 31 or greater and less than 1,000 and the molecular weight region of 1,000 or greater and 40,000 or less.

The mean secondary particle sizes of the particles in the dispersions, and the results of the evaluations conducted by the methods described above, are also shown in Table 1.

TABLE 1

| | Dispersion | | | | | | | | Coated film | |
|---|---|---|---|---|---|---|---|---|---|---|
| | Particle | | Dispersant | | | Solvent | | | Prolonged | Fine | Surface |
| | Type | Mean secondary particle size (nm) | Type | Molecular weight | Amount (g) | Type | Amount (g) | Dispersibility | storage stability | printing property | roughness (nm) |
| Comp. Example 1-1 | Copper (I) oxide | 35 | PEG-MET 800 | 800 | 0.040 | N-butanol | 0.66 | AA | 7 days | C | 2.5 |
| Comp. Example 1-2 | Copper (I) oxide | 40 | PEG-MET 2000 | 2000 | 0.040 | N-butanol | 0.66 | A | >6 mos. | B | 8.4 |
| Comp. Example 1-3 | Copper (I) oxide | 37 | PEG-MET 2000 | 2000 | 0.040 | Distilled water | 0.66 | A | >6 mos. | B | 7.5 |
| Comp. Example 1-4 | Copper (I) oxide | 50 | PEG-MET 6000 | 6000 | 0.040 | Distilled water | 0.66 | A | >6 mos. | B | 10.2 |
| Comp. Example 1-5 | Copper (I) oxide | 67 | PEG-MET 350 | 356 | 0.040 | Ethanol | 0.66 | A | 7 days | C | 5.1 |
| Comp. Example 1-6 | Copper (I) oxide | 75 | 2-Aminoethanethiol | 77 | 0.040 | Ethanol | 0.66 | B | 7 days | C | 12.0 |
| Comp. Example 1-8 | Copper (I) oxide | 51 | PEG COOH 2000 | 2000 | 0.040 | Ethanol | 0.66 | B | 1 day | B | 8.5 |
| Comp. Example 1-9 | Copper (I) oxide | 64 | ME-400SH PEG-MET 6000 | 40,000 6000 | 0.010 0.030 | Ethanol | 0.66 | A | >6 mos. | B | 12.0 |
| Comp. Example 1-10 | Copper (I) oxide | 61 | ME-400SH PEG-MET 2000 | 400,000 2000 | 0.010 0.030 | Ethanol | 0.66 | A | >6 mos. | B | 11.2 |
| Example 1-1 | Copper (I) oxide | 42 | PEG-MET 6000 PEG-MET 800 | 6000 800 | 0.010 0.030 | Distilled water | 0.66 | AA | >6 mos. | AA | 2.3 |
| Example 1-2 | Copper (I) oxide | 45 | PEG-MET 6000 PEG-MET 800 | 6000 800 | 0.020 0.020 | Distilled water | 0.66 | AA | >6 mos. | AA | 2.5 |
| Example 1-3 | Copper (I) oxide | 37 | PEG-MET 2000 PEG-MET 800 | 2000 800 | 0.020 0.020 | Distilled water | 0.66 | AA | >6 mos. | AA | 2.0 |
| Example 1-4 | Copper (I) oxide | 48 | ME-100SH PEG-MET 800 | 10,000 800 | 0.020 0.020 | Distilled water | 0.66 | AA | >6 mos. | AA | 3.5 |
| Example 1-5 | Copper (I) oxide | 46 | PEG-MET 6000 PEG-MET 800 | 6000 800 | 0.030 0.010 | Distilled water | 0.66 | AA | >6 mos. | AA | 5.0 |
| Example 1-6 | Copper (I) oxide | 55 | ME-400SH PEG-MET 800 | 40,000 800 | 0.010 0.030 | Ethanol | 0.66 | AA | >6 mos. | AA | 6.0 |
| Example 1-7 | Copper (I) oxide | 67 | ME-400SH PEG-MET 350 | 40,000 356 | 0.010 0.030 | Ethanol | 0.66 | AA | >6 mos. | A | 5.2 |
| Example 1-8 | Copper (I) oxide | 57 | ME-400SH 2-aminoethanethiol | 40,000 77 | 0.010 0.030 | Ethanol | 0.66 | A | >6 mos. | B | 6.6 |
| Example 1-9 | Copper (I) oxide | 50 | PEG-MET 800 2-aminoethanethiol | 800 77 | 0.010 0.030 | Ethanol | 0.66 | A | >6 mos. | B | 4.6 |
| Example 1-10 | Copper (I) oxide | 62 | ME-400SH PEG-COOH 600 | 40,000 589 | 0.020 0.020 | Ethanol | 0.66 | A | >6 mos. | A | 4.5 |
| Example 1-11 | Copper (I) oxide | 49 | PEG-COOH 5000 PEG-COOH 600 | 5000 589 | 0.020 0.020 | Ethanol | 0.66 | A | >6 mos. | A | 4.8 |
| Example 1-12 | Copper (I) oxide | 45 | BYK145 PEG-PO3H2 400 | 5000 398 | 0.020 0.020 | Ethanol | 0.66 | AA | >6 mos. | AA | 3.2 |

TABLE 1-continued

| | | Dispersion | | | | | | Coated film | | |
|---|---|---|---|---|---|---|---|---|---|---|
| | Particle | | Dispersant | | Solvent | | | | | |
| | Type | Mean secondary particle size (nm) | Type | Molecular weight | Amount (g) | Type | Amount (g) | Dispersibility | Prolonged storage stability | Fine printing property | Surface roughness (nm) |
| Example 1-13 | Silver | 521 | PEG-MET 6000<br>PEG-MET 800 | 6000<br>800 | 0.010<br>0.030 | Distilled water | 0.76 | AA | >6 mos. | AA | 3.5 |
| Example 1-14 | Silver | 501 | PEG-MET 6000<br>PEG-MET 800 | 6000<br>800 | 0.020<br>0.020 | Distilled water | 0.76 | AA | >6 mos. | AA | 3.8 |
| Example 1-15 | Silver | 572 | PEG-MET 2000<br>PEG-MET 800 | 2000<br>800 | 0.020<br>0.020 | Distilled water | 0.76 | AA | >6 mos. | AA | 3.2 |
| Example 1-16 | Silver | 591 | ME-100SH<br>PEG-MET 800 | 10,000<br>800 | 0.020<br>0.020 | Distilled water | 0.76 | AA | >6 mos. | AA | 4.5 |

TABLE 2

| | Volume resistivity (μΩcm) |
|---|---|
| Comp. Example 1-1 | 8.2 |
| Comp. Example 1-6 | 51.0 |
| Example 1-1 | 7.2 |

The names of the dispersants in Table 1 are as follows.

PEG-MET 350: O-(2-Mercaptoethyl)-O'-methyl-hexa(ethylene glycol), molecular weight: 356.48

PEG-MET 800: Poly(ethylene glycol) methyl ether thiol, number-average molecular weight: 800 (Aldrich Co.)

PEG-MET 2000: Poly(ethylene glycol) methyl ether thiol, number-average molecular weight: 2,000 (Aldrich Co.)

PEG-MET 6000: Poly(ethylene glycol) methyl ether thiol, number-average molecular weight: 6,000 (Aldrich Co.)

ME-100SH: SUNBRIGHT ME-100SH (trade name of NOF Corp.), poly(ethylene glycol) methyl ether thiol, number-average molecular weight: 10,000

ME-400SH: SUNBRIGHT ME-400SH (trade name of NOF Corp.), poly(ethylene glycol) methyl ether thiol, number-average molecular weight: 40,000

PEG-COOH 600: O-(2-Carboxyethyl)-O'-methyl-undecaethylene glycol, molecular weight: 588.68 (Aldrich Co.)

PEG-COOH 2000: O-Methyl-O'-succinylpolyethylene glycol, number-average molecular weight: 2,000 (Aldrich Co.)

PEG-COOH 5000: O-(Carboxymethyl)-O'-methylpolyethylene glycol, number-average molecular weight: 5,000 (Aldrich Co.)

PEG-PO3H2 400: 11-{2-(2-(2-Methoxyethoxy)ethoxy)ethoxy}undecylphosphonic acid, molecular weight: 398.47 (Dojindo Laboratories)

byk-145: Disperbyk-145 (trade name of Byk-Chemie Corp.), phosphonic acid compound, molecular weight: 5,000

Figure 5:
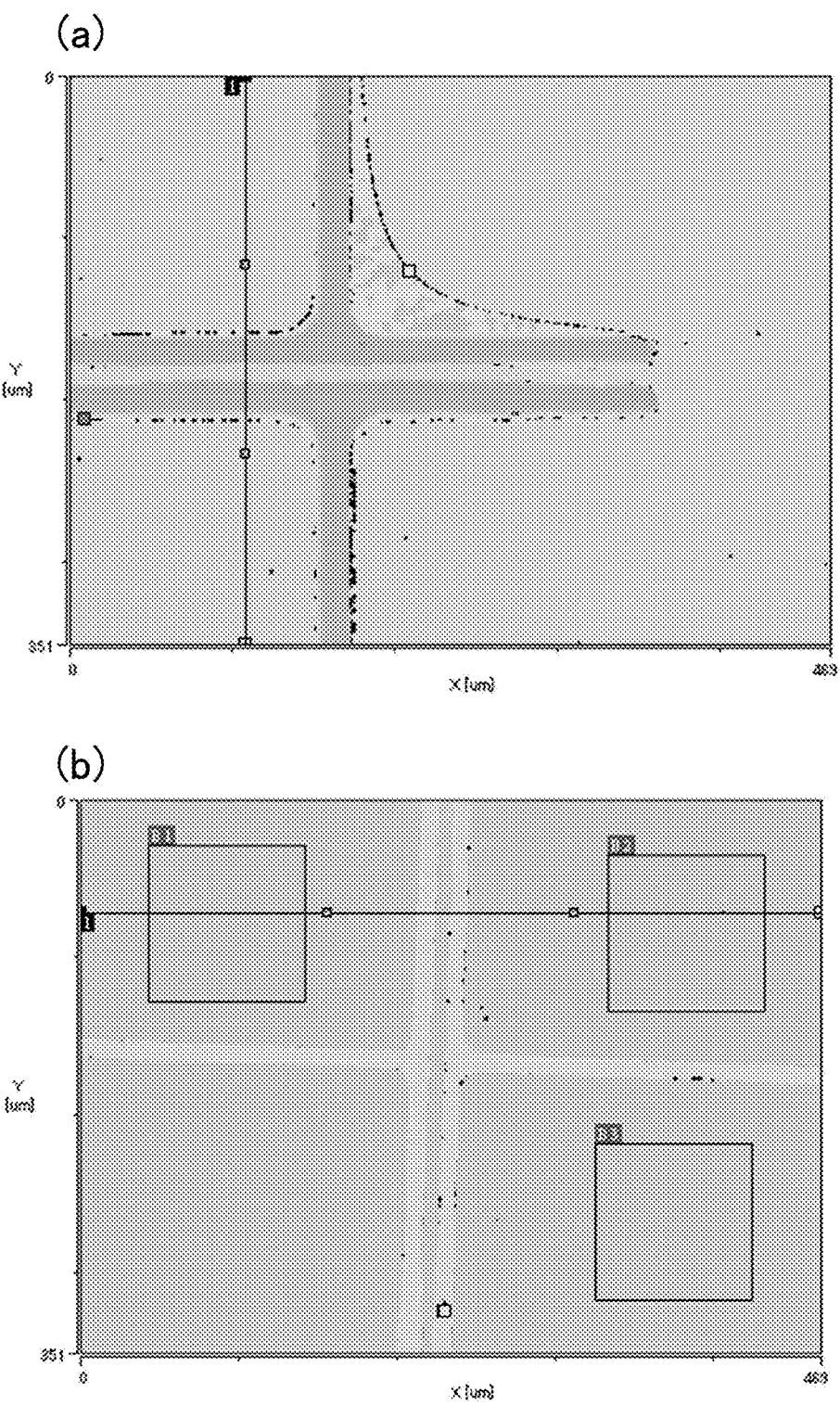
FIG. 5 shows photomicrographs of (a) printed matter surface in which a removal defect has occurred, as obtained in Comparative Example 1-1 and (b) is a photomicrograph of a satisfactory printed matter surface, as obtained in Example 1-1.

FIG. 5 portion(a) shows a photomicrograph of the print pattern obtained in Comparative Example 1-1, and FIG. 5 portion(b) shows a photomicrograph of the print pattern obtained in Example 1-1. In the pattern of FIG. 5 portion(a) (Comparative Example 1-1), a phenomenon of "foot trailing" of the pattern is seen in the region through which the two lines cross perpendicularly, indicating that removability of the coating film by the removal plate in reverse printing was insufficient. In contrast, the pattern of FIG. 5 portion(b) (Example 1-1) was cleanly formed even in the region through which the two lines cross perpendicularly.

Figure 4:
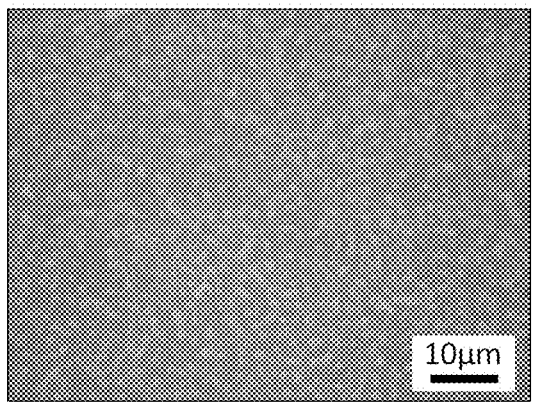
FIG. 4 shows photomicrographs of (a) the dispersion-coated film surface of Comparative Example 1-2, (b) the dispersion-coated film surface of Comparative Example 1-3 and (c) the dispersion-coated film surface of Comparative Example 1-4.
Figure 4:
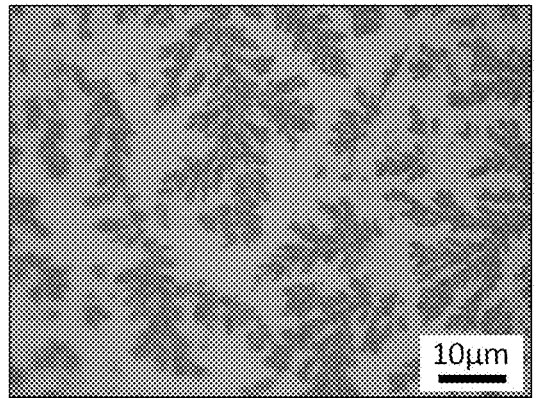
Figure 4:
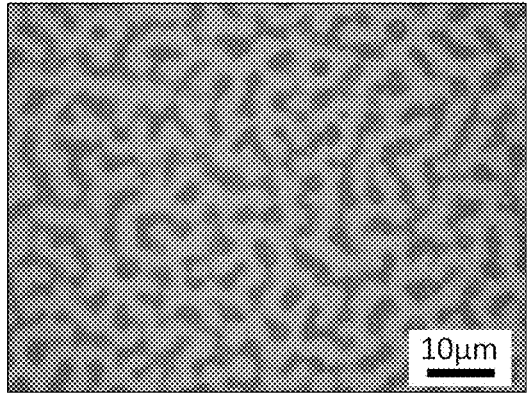

FIG. 4 portion(a) to portion(c) show photomicrographs of the coated films obtained in Comparative Examples 1-2 to 1-4, respectively. Referring to these photographs, it is seen that all of the coated films had crystallized, and the surfaces were irregular.

Figure 3:
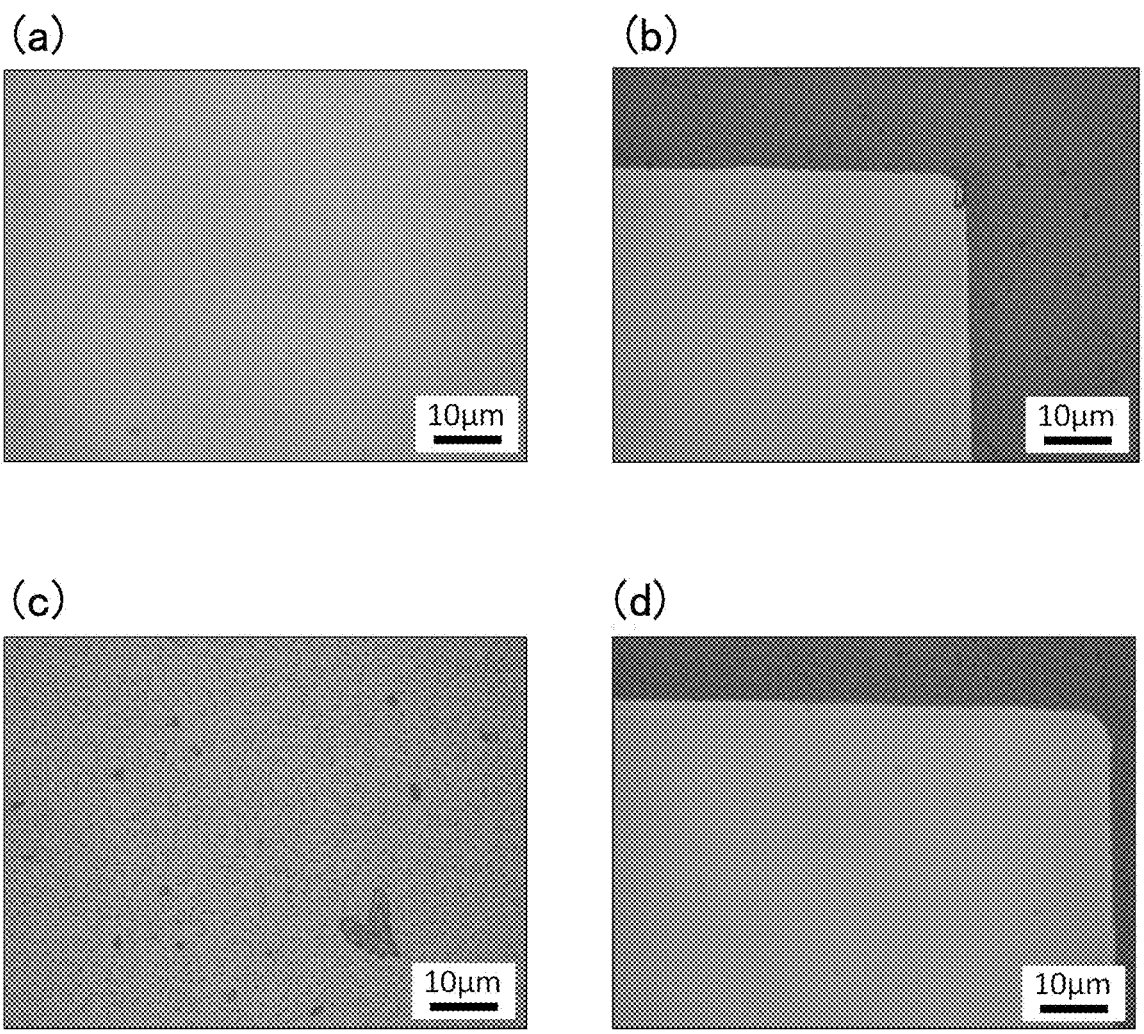
FIG. 3 shows photomicrographs of (a) the dispersion-coated film surface of Example 1-1, (b) the dispersion-coated film surface of Example 1-2, (c) the dispersion-coated film surface of Example 1-4 and (d) the dispersion-coated film surface of Example 1-5.

FIG. 3 portion(a) to portion(d) show photomicrographs of the coated films obtained in Examples 1, 2, 4 and 5, respectively. It is seen that flat coated films were obtained in all cases.

It was thus verified that the dispersion of the invention is suitable for fine printing by a reverse printing method.

Figure 8:
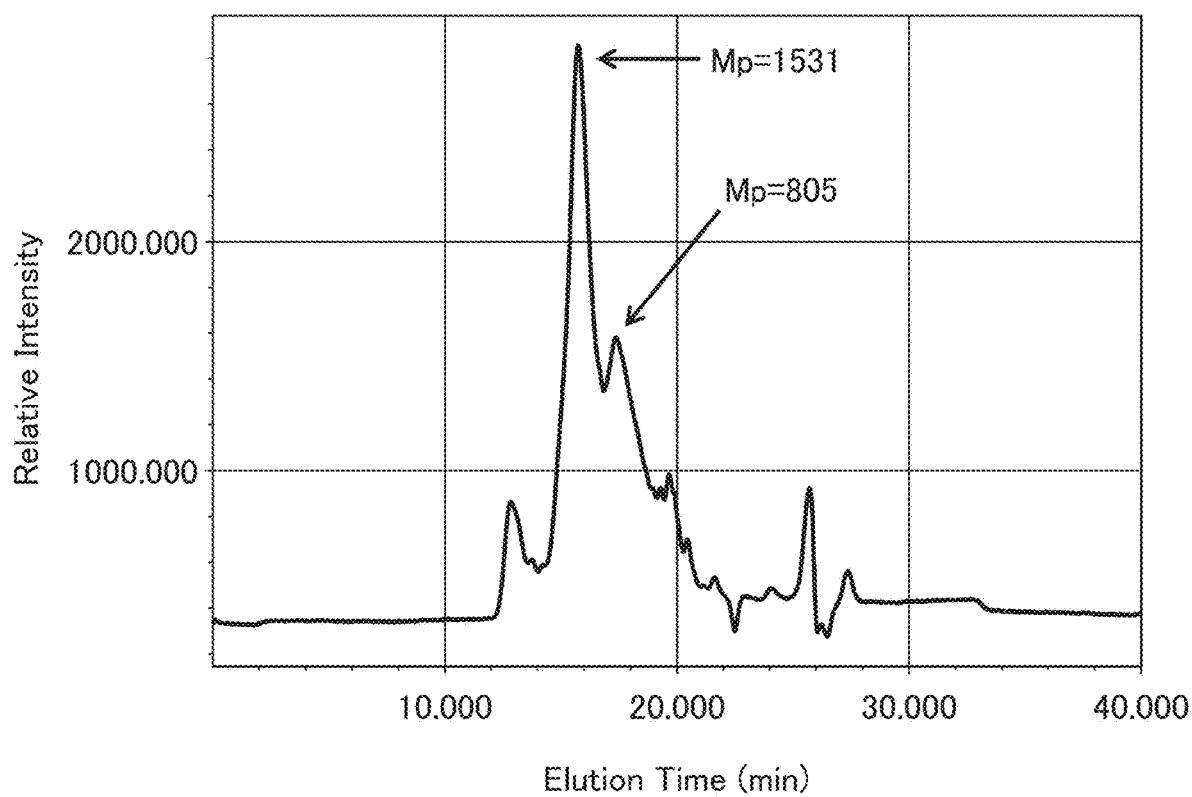
FIG. 8 is a GPC chart for the dispersant in the coated film obtained in Example 1-3.

The coated film obtained in Example 1-3 was dipped in water that had been heated to 90° C., to extract the dispersant. The obtained extract was concentrated to prepare a sample for GPC. FIG. 8 shows a GPC chart as measured for the sample. In the chart of FIG. 8, a peak at a molecular weight of 1,531 (Mp=1531) and a peak at a molecular weight of 805 (Mp=805), in terms of polyethylene glycol, were confirmed.

Figure 6:
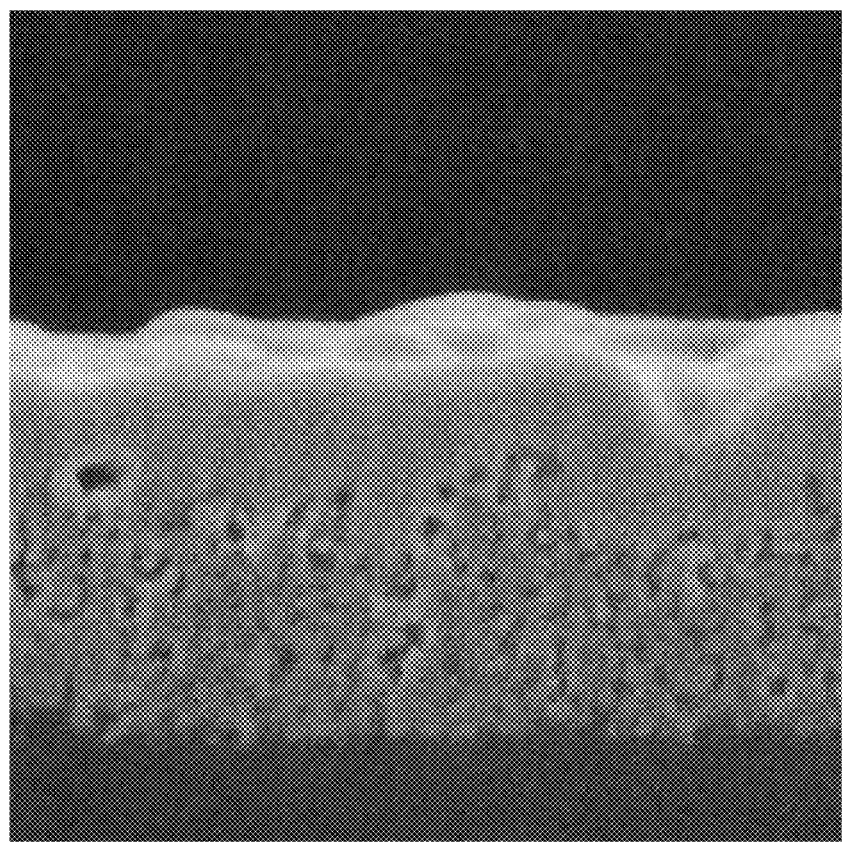
FIG. 6 is a cross-sectional SEM image of the conductive film obtained in Example 1-1.
Figure 7:
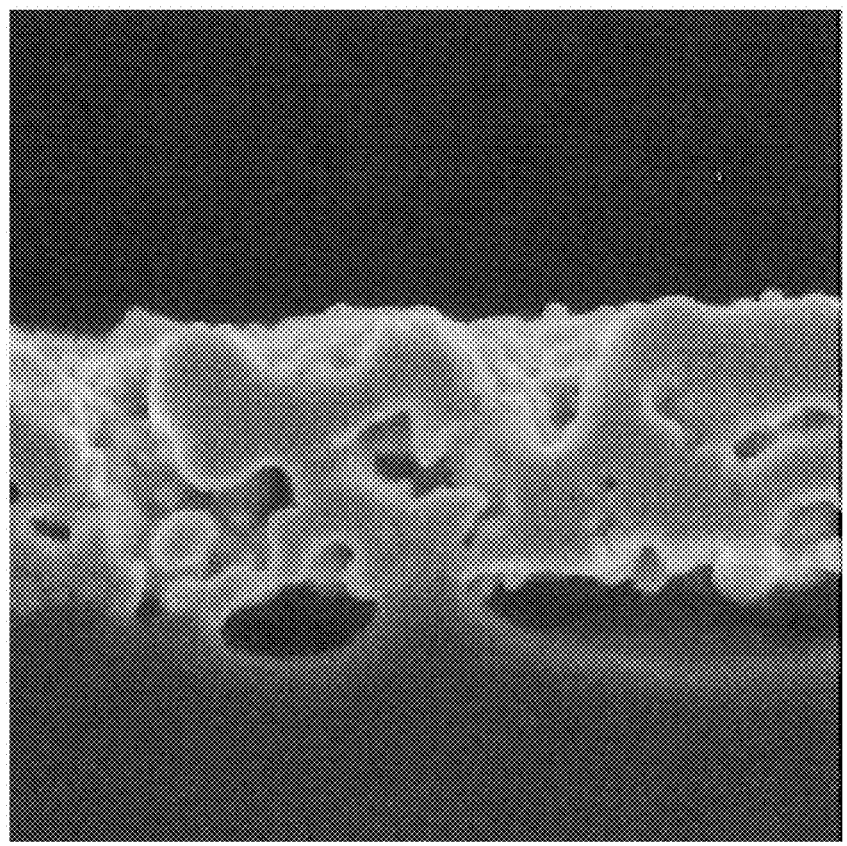
FIG. 7 is a cross-sectional SEM image of the conductive film obtained in Comparative Example 1-1.

FIG. 6 and FIG. 7 show cross-sectional SEM images of the conductive films obtained in Example 1-1 and Comparative Example 1-1, respectively.

From FIG. 6 it is clearly seen that the conductive film obtained in the Example was a two-layer film, composed of a comparatively dense upper layer and a lower layer with microvoids. Based on XPS analysis, it was shown that the upper layer was a metal layer composed mainly of copper, while the lower layer was a hybrid layer composed mainly of copper(I) oxide and an organic material. No substrate damage was observed with the Example.

From FIG. 7 it is seen that the film obtained in the Comparative Example had poor surface smoothness and failed to have a dense metal layer formed, while the substrate had undergone damage.

The dispersions obtained in Comparative Examples 2-1 to 2-9 and Examples 2-1 to 2-10 described below were each evaluated in the following manner.

[Formation of Conductive Film]

The dispersions of Comparative Examples 2-1 to 2-9 and Examples 2-1 to 2-10 were each coated onto a PET film (A4300, product of Toyobo, Ltd., thickness: 125 μm) using a bar coater to form a coated film, and using microwave plasma furnace, a process gas (3 vol % hydrogen, 97 vol % helium) was introduced into the vacuum chamber at a flow rate of 300 sccm while firing the coated film for 5 minutes with an output of 1.5 kW to obtain a conductive film with a thickness of 0.2 μm. The dimensional changes of all of the obtained films were less than 0.05%, and no noticeable deformation such as wrinkles were noticed. The volume resistivity values of the obtained conductive films are shown in Table 3.

The conductive film obtained in Example 1-1 was measured by XPS while sputtering the surface with argon plasma, to obtain the relative element concentration profile in the thickness direction. The profile is shown in FIG. 9.

Figure 9:
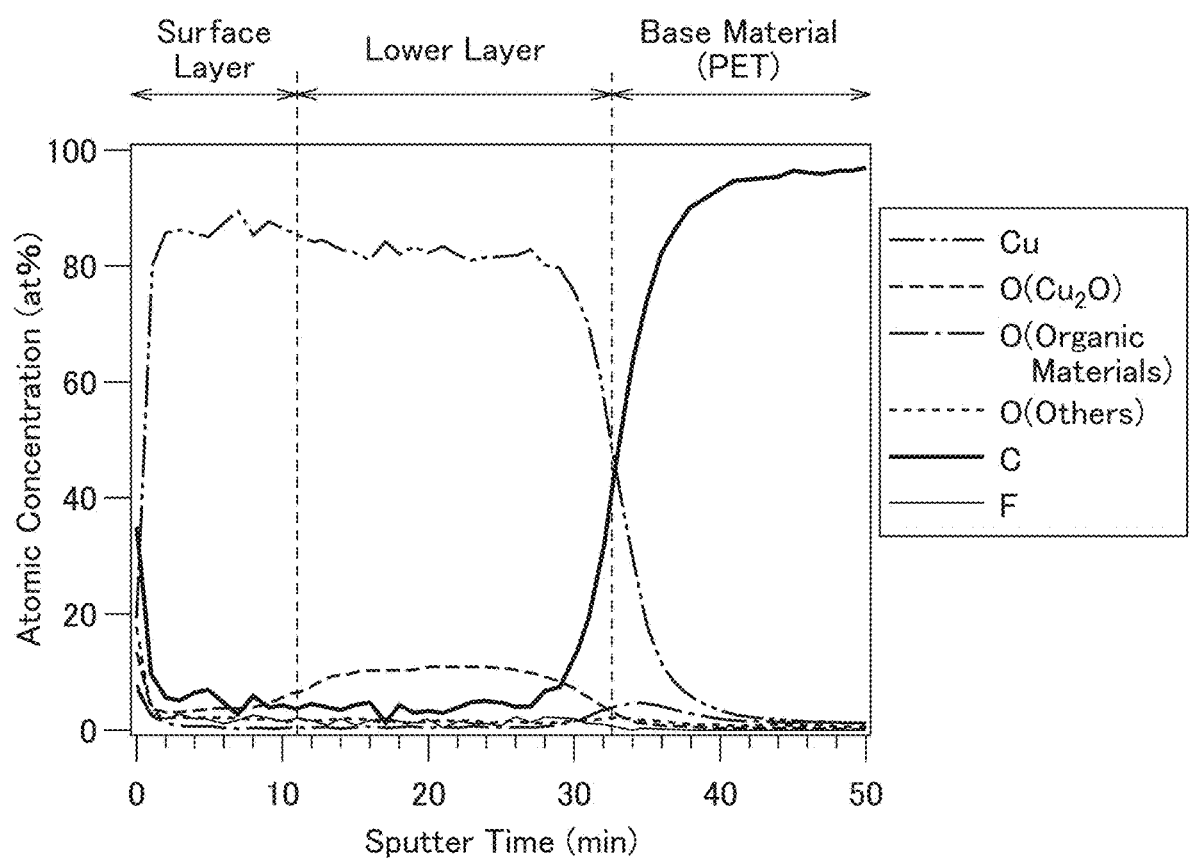
FIG. 9 is a graph showing the profile of the relative element concentration in the depthwise direction of the conductive film obtained in Example 1-1.

Referring to FIG. 9, the surface layer of the conductive film had a low oxygen element concentration deriving from copper oxide, showing that it was composed mainly of copper in the metallic state. The lower layer of the conductive film had a high oxygen concentration deriving from copper oxide, and thus contained abundant copper oxide. In FIG. 9, the copper element concentration of the outer surface of the conductive film is low. This phenomenon presumably occurred because during storage after the conductive film had been formed by firing, the outer surface of the film was oxidized, and fouled by the organic materials present in the air.

Comparative Example 2-1

In a mixed solvent of 800 g of water and 400 g of 1,2-propylene glycol (Wako Pure Chemical Industries, Ltd.) there was dissolved 80 g of copper(II) acetate monohydrate (Wako Pure Chemical Industries, Ltd.), and then 24 g of hydrazine (Wako Pure Chemical Industries, Ltd.) was added, the mixture was stirred, and the supernatant and precipitate were separated by centrifugation. The precipitate consisted of particles composed mainly of copper(I) oxide, having a mean primary particle size of 15 nm and a mean secondary particle size of 30 nm.

To 30 g of the obtained precipitate there were added 4.0 g of Disperbyk-145 (product of BYK-Chemie GmbH) as a dispersant and 66 g of n-butanol (Wako Pure Chemical Industries, Ltd.) as a solvent, and a homogenizer was used for dispersion to obtain a dispersion for Comparative Example 2-1 containing copper(I) oxide particles.

Examples 2-1 to 2-5 and 2-10, and Comparative Examples 2-2 to 2-9

To 1.0 g of the dispersion of Comparative Example 2-1 there were added sulfur atom-containing substances having the types and amounts listed in Table 1, and a homogenizer was used for stirring to obtain dispersions for Examples 2-1 to 2-5 and 2-10 and Comparative Examples 1-2 to 2-9, each containing copper(I) oxide particles.

The sulfur used in Example 2-1 was α-sulfur, and the copper(II) sulfide used in Comparative Example 2-8 was copper(II) sulfide pentahydrate.

Example 2-6

In a mixed solvent of 800 g of water and 400 g of 1,2-propylene glycol (Wako Pure Chemical Industries, Ltd.) there was dissolved 80 g of copper(II) acetate monohydrate (Wako Pure Chemical Industries, Ltd.), and then 24 g of hydrazine (Wako Pure Chemical Industries, Ltd.) was added, the mixture was stirred, and the supernatant and precipitate were separated by centrifugation. To 0.3 g of the obtained precipitate there were added 0.040 g of poly(ethylene glycol) methyl ether thiol with a number-average molecular weight of 800 (Aldrich Co.), as a sulfur atom-containing substance, and 0.66 g of n-butanol (Wako Pure Chemical Industries, Ltd.) as a solvent, and a homogenizer was used for dispersion to obtain a dispersion for Example 2-6 containing copper(I) oxide particles.

Examples 2-7 to 2-9

Dispersions for Examples 2-7 to 2-9 each containing copper(I) oxide particles were obtained by the same method as Example 2-6, except for using the types and amounts of compounds listed in Table 2 as the sulfur atom-containing substance in Example 2-6.

TABLE 3

| | Dispersion composition | | | | | | Copper film |
|---|---|---|---|---|---|---|---|
| | Particles | | Sulfur atom-containing substance | | Dispersant | | |
| | Type | Amount (g) | Type | Amount (g) | Type | Amount (g) | Resistivity (μΩ · cm) |
| Comp. Example 2-1 | Copper (I) oxide | 0.3 | — | — | Byk-145 | 0.04 | 15.0 |
| Example 2-1 | Copper (I) oxide | 0.3 | Sulfur | 0.01 | Byk-145 | 0.04 | 6.9 |
| Example 2-2 | Copper (I) oxide | 0.3 | 2,2'-Dithiodiethanol | 0.025 | Byk-145 | 0.04 | 6.5 |
| Example 2-3 | Copper (I) oxide | 0.3 | Dimethyl trisulfide | 0.015 | Byk-145 | 0.04 | 6.9 |
| Example 2-4 | Copper (I) oxide | 0.3 | bis(Pentamethylene) thiuram tetrasulfide | 0.015 | Byk-145 | 0.04 | 5.2 |
| Example 2-5 | Copper (I) oxide | 0.3 | Ammonium thiosulfate | 0.015 | Byk-145 | 0.04 | 5.9 |
| Example 2-6 | Copper (I) oxide | 0.3 | Poly(ethylene glycol) methyl ether thiol (Mn = 800) | 0.04 | — | — | 9.5 |
| Example 2-7 | Copper (I) oxide | 0.3 | Poly(ethylene glycol) methyl ether thiol (Mn = 2,000) | 0.04 | — | — | 10.1 |
| Example 2-8 | Copper (I) oxide | 0.3 | Poly(ethylene glycol) methyl ether thiol (Mn = 6,000) | 0.04 | — | — | 9.3 |
| Example 2-9 | Copper (I) oxide | 0.3 | ME-400SH | 0.04 | — | — | 10.5 |
| Example 2-10 | Copper (I) oxide | 0.3 | Poly(ethylene glycol) methyl ether thiol (Mn = 800) | 0.015 | Byk-145 | 0.04 | 10.0 |

TABLE 3-continued

|  | Dispersion composition | | | | | | Copper film |
|---|---|---|---|---|---|---|---|
|  | Particles | | Sulfur atom-containing substance | | Dispersant | | |
|  | Type | Amount (g) | Type | Amount (g) | Type | Amount (g) | Resistivity (μΩ · cm) |
| Comp. Example 2-2 | Copper (I) oxide | 0.3 | Diphenyl sulfide | 0.087 | Byk-145 | 0.04 | 18.0 |
| Comp. Example 2-3 | Copper (I) oxide | 0.3 | Diphenylsulfone | 0.1 | Byk-145 | 0.04 | 19.0 |
| Comp. Example 2-4 | Copper (I) oxide | 0.3 | Diphenyl sulfoxide | 0.095 | Byk-145 | 0.04 | 50.0 |
| Comp. Example 2-5 | Copper (I) oxide | 0.3 | Benzenesulfonic acid | 0.074 | Byk-145 | 0.04 | 30.0 |
| Comp. Example 2-6 | Copper (I) oxide | 0.3 | Ethyl p-toluenesulfonate | 0.094 | Byk-145 | 0.04 | 15.0 |
| Comp. Example 2-7 | Copper (I) oxide | 0.3 | Taurine | 0.059 | Byk-145 | 0.04 | 35.0 |
| Comp. Example 2-8 | Copper (I) oxide | 0.3 | Copper sulfide (II) | 0.045 | Byk-145 | 0.04 | 21.0 |
| Comp. Example 2-9 | Copper (I) oxide | 0.3 | 2,2-Thiodiethanol | 0.057 | Byk-145 | 0.04 | 25.0 |

The dispersions obtained in Examples 3-1 to 3-6 were each evaluated in the following manner. The evaluation results are shown in Table 4. For comparison, the dispersion obtained in Comparative Example 2-1 was also evaluated in the following manner, and the results are also shown in Table 4.

[Formation of Conductive Film]

Each dispersion was coated onto a PET film (A4300, product of Toyobo, Ltd., thickness: 125 μm) using a bar coater to form a coated film, and heated for 10 minutes on a hot plate that had been heated to 150° C., to obtain a conductive film with a thickness of 0.2 μm. The dimensional changes of all of the obtained films were less than 0.05%, and no noticeable deformation such as wrinkles were noticed. The volume resistivity values of the obtained conductive films are shown in Table 3. With the dispersion of Comparative Example 2-1, no reduction in resistance was seen, and the resistivity could not be measured.

Examples 3-1 to 3-6

To 1.0 g of the dispersion obtained in Comparative Example 2-1 there were added sulfur atom-containing substances having the types and amounts listed in Table 4, and a homogenizer was used for stirring to obtain dispersions for Examples 3-1 to 3-6.

TABLE 4

|  | Dispersion composition | | | | | | Copper film |
|---|---|---|---|---|---|---|---|
|  | Particles | | Sulfur atom-containing substance | | Dispersant | | |
|  | Type | Amount (g) | Type | Amount (g) | Type | Amount (g) | Resistivity (μΩ · cm) |
| Comp. Example 2-1 | Copper (I) oxide | 0.3 | — | — | Byk-145 | 0.04 | — |
| Example 3-1 | Copper (I) oxide | 0.3 | Sulfur | 0.1 | Byk-145 | 0.04 | 630 |
| Example 3-2 | Copper (I) oxide | 0.3 | 2,2'-Dithiodiethanol | 0.1 | Byk-145 | 0.04 | 550 |
| Example 3-3 | Copper (I) oxide | 0.3 | Dimethyl trisulfide | 0.1 | Byk-145 | 0.04 | 410 |
| Example 3-4 | Copper (I) oxide | 0.3 | bis(Pentamethylene) thiuram tetrasulfide | 0.1 | Byk-145 | 0.04 | 370 |
| Example 3-5 | Copper (I) oxide | 0.3 | Ammonium thiosulfate | 0.1 | Byk-145 | 0.04 | 350 |
| Example 3-6 | Copper (I) oxide | 0.3 | 2-Aminoethanethiol | 0.1 | Byk-145 | 0.04 | 580 |

INDUSTRIAL APPLICABILITY

With the dispersion of the present invention it is possible to obtain fine wirings by coating and firing. The dispersion can therefore be suitably used for manufacture of printed circuit boards and electronic devices.

The invention claimed is:

1. A dispersion including particles comprising one or more types selected from gold, silver, silver oxide, copper and copper oxide, and a dispersant,
wherein a mean secondary particle size of the particles is 5 nm or greater and 1,000 nm or less;
wherein the dispersant has a chemical structure selected from the group consisting of amine, pyrrolidone, thiol, selenol, polysulfide, polyserenide, carboxylic acid, sulfonic acid, phosphonic acid, and phosphonic acid ester, and
wherein the dispersant contains a low number average molecular-weight component that has at least one peak within a molecular weight region of 31 or greater and less than 1,000 and a high number average molecular-weight component that has at least one peak within a molecular weight region of 1,500 or greater and 40,000 or less, in the molecular weight distribution curve in terms of polyethylene glycol, as determined by gel permeation chromatography.

2. The dispersion according to claim 1, wherein the proportion of the high number average molecular-weight component in the dispersant is 5 parts by mass or greater and 500 parts by mass or less with respect to 100 parts by mass of the low-molecular-weight component.

3. The dispersion according to claim 1, wherein the particles contain one or more types selected from the group consisting of copper and copper oxide.

4. The dispersion according to claim 1, wherein the dispersant has one or more backbones selected from the group consisting of polyethylene glycol and polypropylene glycol.

5. A method for producing a conductive film which includes:
a step of coating a dispersion according to claim 1 onto a base material to form a coated film, and
a step of heated firing of the coated film.

6. The method for producing a conductive film according to claim 5, wherein the heating step is carried out by plasma treatment or flash lamp annealing treatment.

7. The dispersant according to claim 1, wherein the chemical structure of the dispersant is selected from the group consisting of thiol, carboxylic acid, sulfonic acid, phosphonic acid, and phosphonic acid ester.

* * * * *